United States Patent [19]

Holt

[11] Patent Number: 4,648,180

[45] Date of Patent: * Mar. 10, 1987

[54] METHOD OF PRODUCING A WIRED CIRCUIT BOARD

[75] Inventor: Richard C. Holt, Fairhaven, Mass.

[73] Assignee: Augat Inc., Mansfield, Mass.

[*] Notice: The portion of the term of this patent subsequent to Dec. 9, 2003 has been disclaimed.

[21] Appl. No.: 696,151

[22] Filed: Jan. 29, 1985

Related U.S. Application Data

[63] Continuation-in-part of Ser. No. 549,484, Nov. 4, 1983.

[51] Int. Cl.⁴ .............................................. H05K 3/02
[52] U.S. Cl. ..................................... 29/847; 29/846; 174/68.5; 339/17 C
[58] Field of Search ................. 29/423, 846, 847, 850, 29/857; 83/126, 620; 174/68.5; 339/17 C; 427/96; 428/40, 109, 246, 247, 344

[56] References Cited

U.S. PATENT DOCUMENTS

| | | |
|---|---|---|
| 2,958,926 | 11/1960 | Morison . |
| 3,191,100 | 6/1965 | Sorvillo . |
| 3,234,629 | 2/1966 | Wheeler . |
| 3,239,396 | 3/1966 | Bohannon, Jr. . |
| 3,247,314 | 4/1966 | Mittendorf . |
| 3,279,040 | 10/1966 | Propster, Jr. . |
| 3,295,189 | 1/1967 | Hammell . |
| 3,353,263 | 11/1967 | Helms . |
| 3,567,999 | 3/1971 | Larson et al. . |
| 3,644,792 | 2/1972 | Fields . |
| 3,646,572 | 2/1972 | Burr . |
| 3,674,914 | 7/1972 | Burr . |
| 3,701,838 | 10/1972 | Olney, Jr. . |
| 3,778,899 | 12/1973 | Johnson . |
| 3,786,172 | 1/1974 | Conley . |
| 3,842,190 | 10/1974 | Towell . |
| 3,981,076 | 9/1976 | Nicolas . |
| 4,097,684 | 6/1978 | Burr . |
| 4,387,509 | 6/1983 | Dechelette . |
| 4,414,741 | 11/1983 | Holt . |

OTHER PUBLICATIONS

IPC-DW-425 Standard Specification Proposal Design & End Product Requirements for Discrete Wiring Board, 4/1981.
Scotchflex Breadboard System (3M).
EDN Sep. 5, 1979, p. 227, Space Saving, Low Cost Prototype Boards Use Insulation-Displacement Contacts.

List Continued on next page.

Primary Examiner—Howard N. Goldberg
Assistant Examiner—Carl J. Arbes
Attorney, Agent, or Firm—Weingarten, Schurgin, Gagnebin & Hayes

[57] ABSTRACT

A method for producing a wired circuit board is disclosed in which a wire mat is formed on a fixture and then mated with a circuit board having a specified conductive pad layout on the board surface. A continuous wire is routed on a fixture along a predetermined path over a thermoplastic adhesive layer and the wire is adhered to the layer to fixably position the wire in the routed configuration. The continuous wire is severed at selected locations to form a plurality of wire nets. A wire mat thus formed is mated with a circuit board having conductive pads disposed on the board surface such that selected points of selected wires confront selected conductive pads on the circuit board. Compressive pressure is applied to the wire mat and circuit board to conformally adhere the wire mat to the circuit board. The circuit board and wire mat adhered thereto are next heated at elevated temperature to cure the adhesive layer. Selected points of wires confronting conductive pads on the circuit board are then soldered to the respective pads to complete interconnection of predetermined conductive pads on the circuit board thereby yielding a wired circuit board adapted to receive integrated circuit and other electrical components. A wire mat produced in the disclosed manner may be applied to one or both circuit board surfaces. In another embodiment of the invention the continuous wire is severed after mating the wire mat to the circuit board and curing the adhesive layer.

12 Claims, 65 Drawing Figures

OTHER PUBLICATIONS

Solder Wrap Automatic Interonnection Equipment Brochure of United Solder Wrap Inc.

Wiring System is Multifaceted, reprint from *Electronics*, Apr. 28, 1977.

High-Speed Wire-and-Solder Technique Tests Connections as it Makes Them, Reprint from *Electronics*, Apr. 14, 1977.

New Design Doubles Wiring Density of Multiwire Process reprint from *Electronic Review*.

Wiring Technology Moves to Keep Pace with Circuit Density Electronic Packaging and Production.

What is Solder-Wrap®?; brochure by United Wiring & Manufacturing Co. Inc., Multiwire TM, a brochure from Photocircuits.

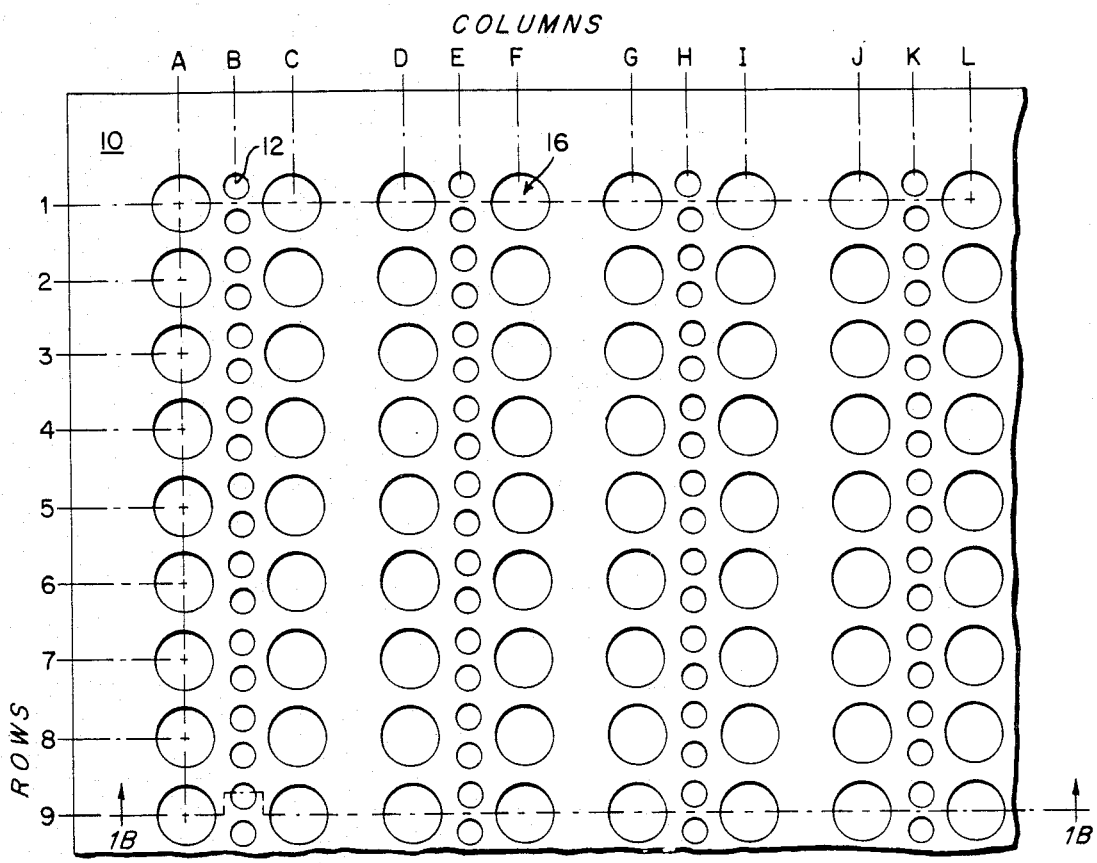
Fig. 1A WIRING FIXTURE PLATE
Fig. 1B
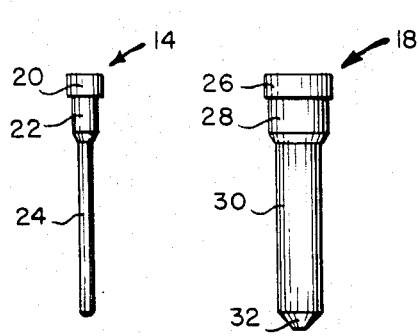
Fig. 2A  Fig. 2B
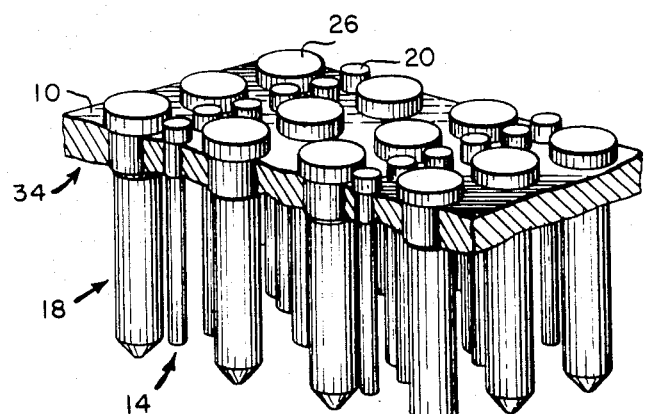
Fig. 3

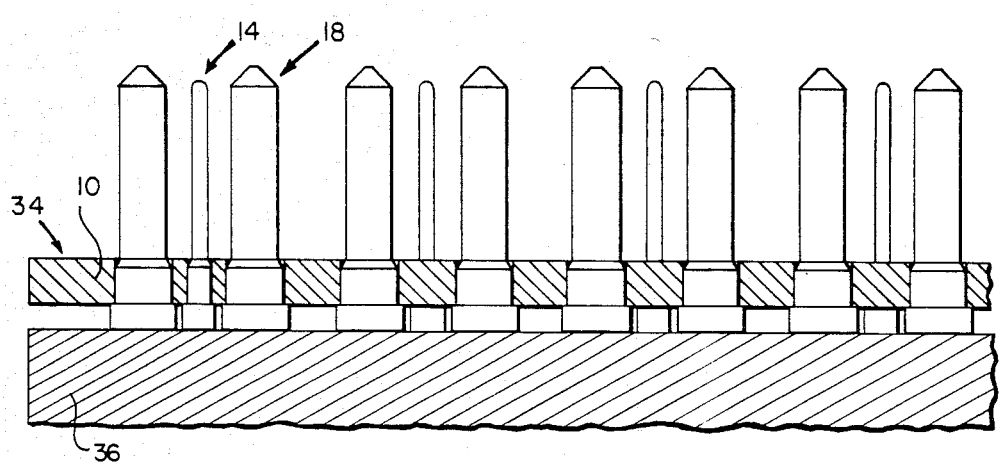
Fig. 4
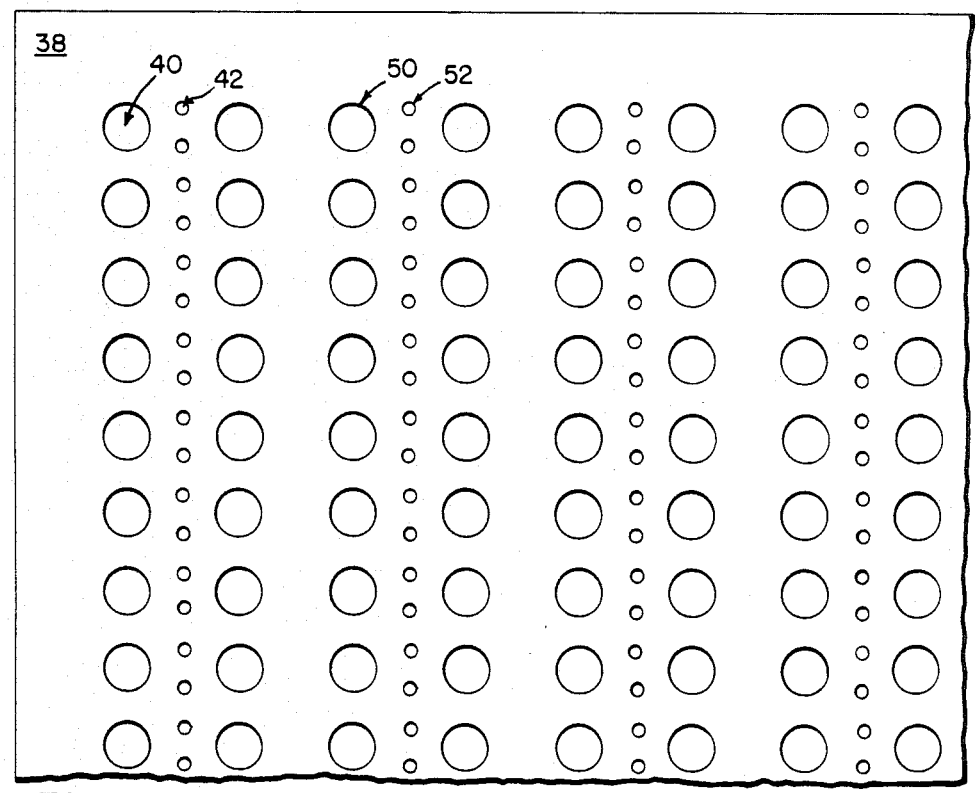
Fig. 5 PIN RETAINING PLATE

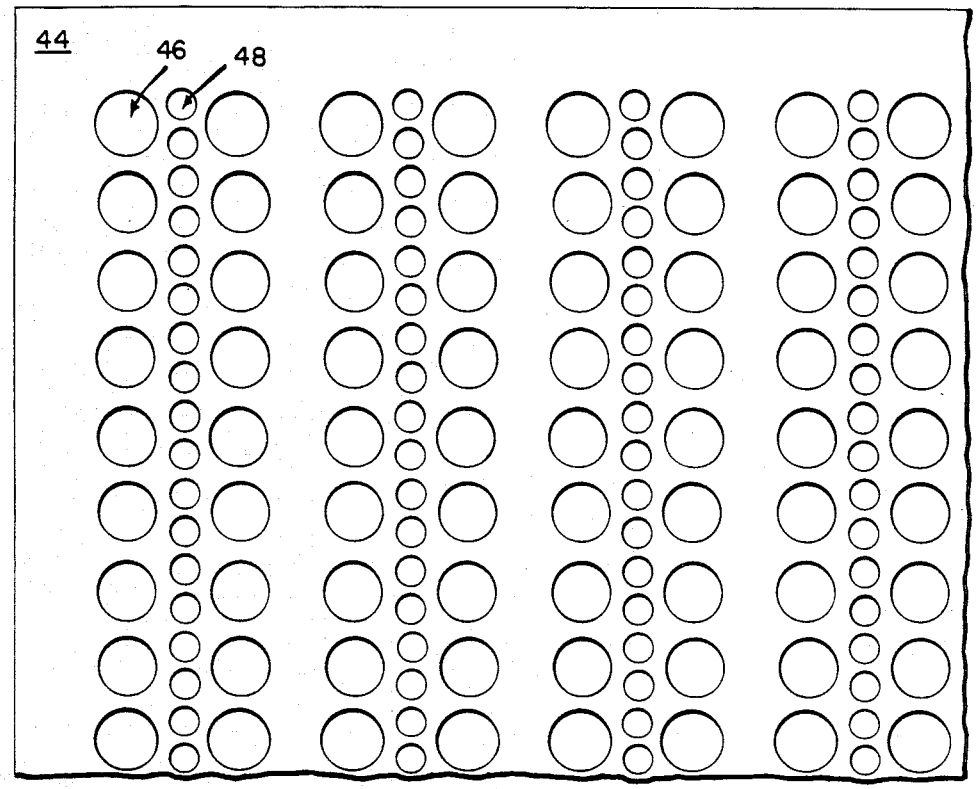
Fig. 6 CLEARANCE PLATE
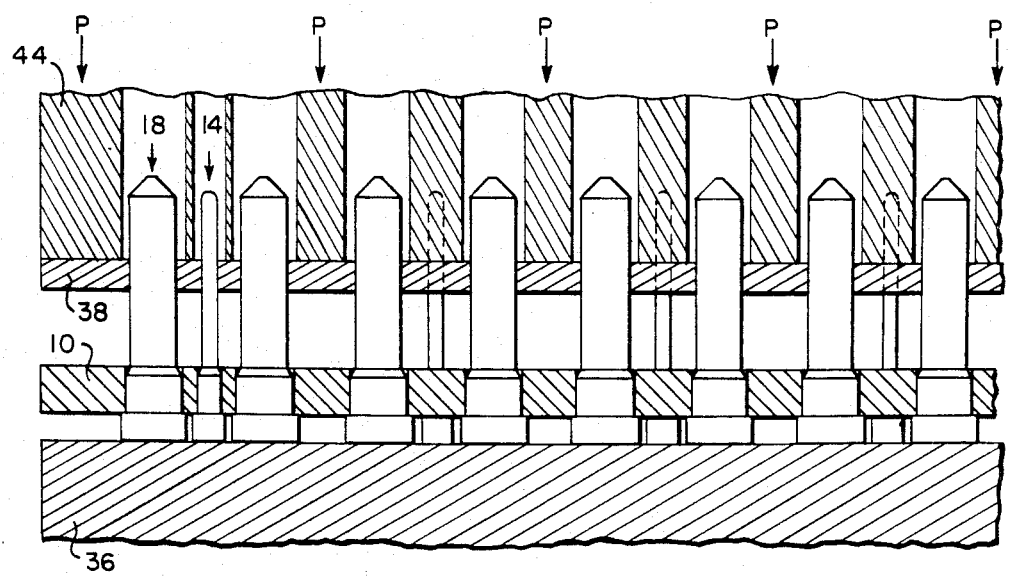
Fig. 7

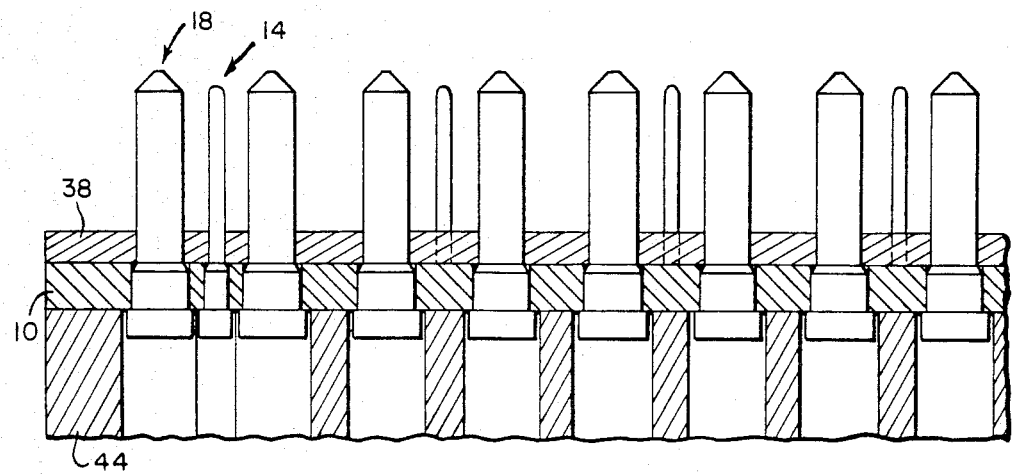
Fig. 8
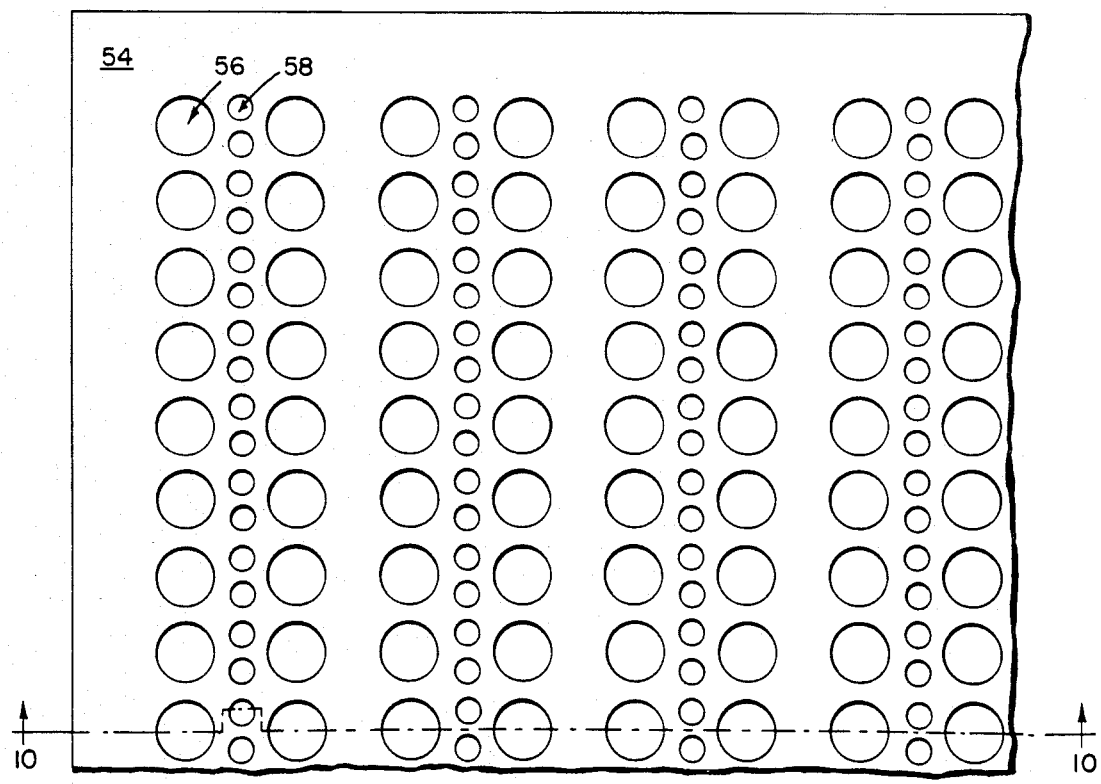
Fig. 9  CUTTER BACKING PLATE

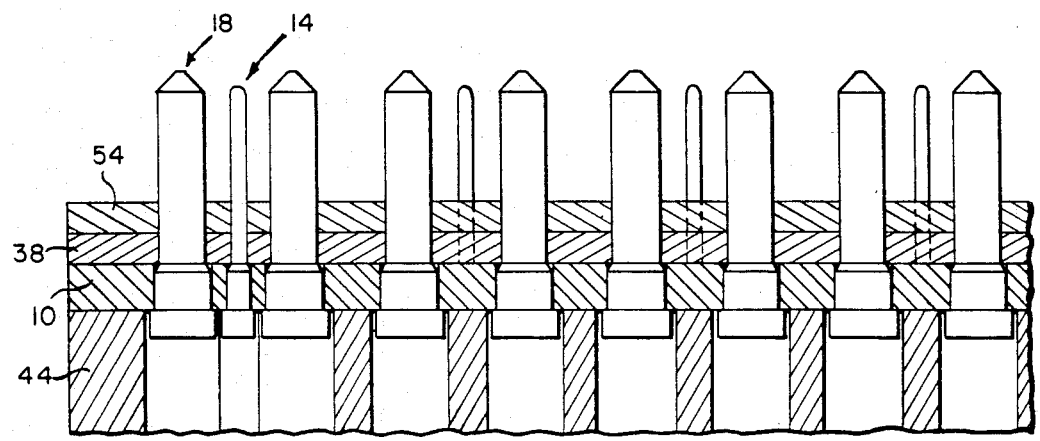
Fig. 10
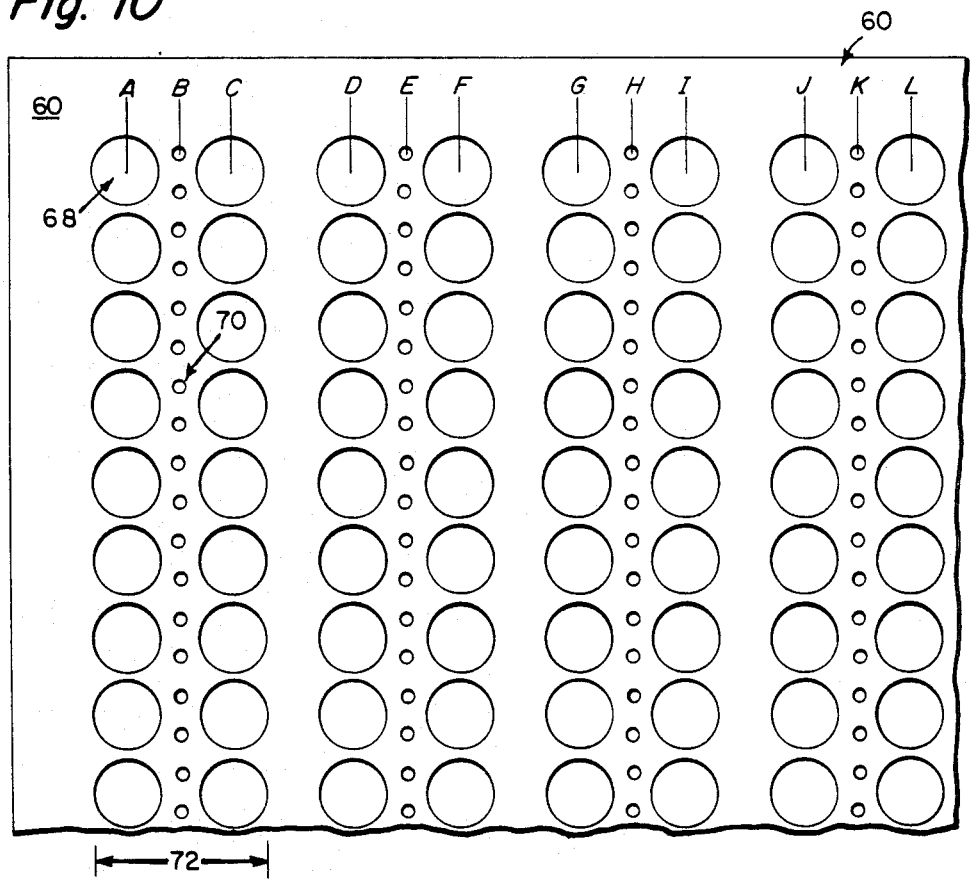
Fig. 11A  FIRST MULTI-LAYERED SHEET
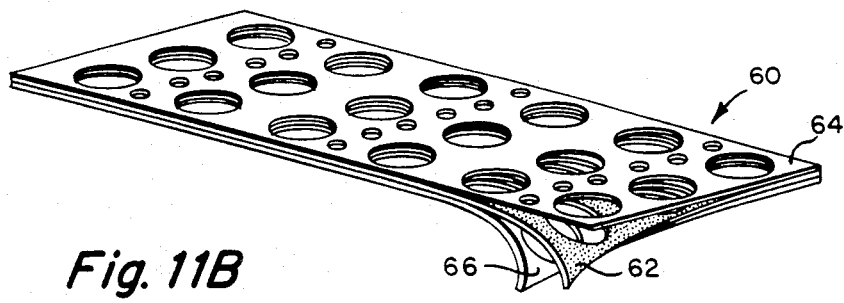
Fig. 11B

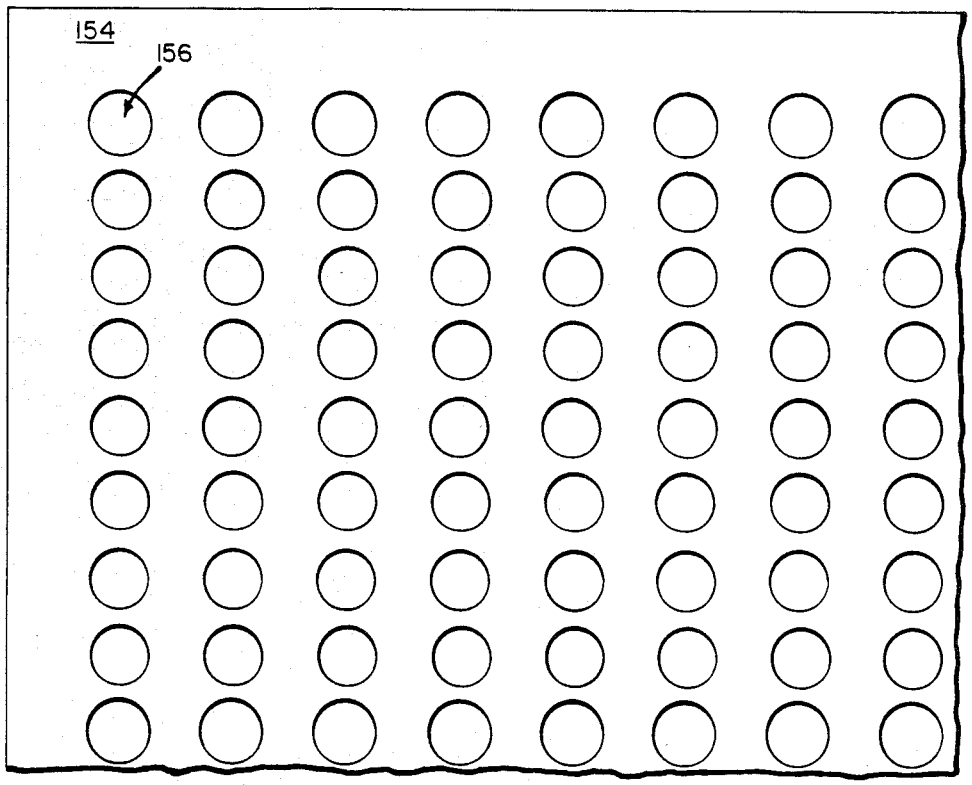
Fig. 18 PRESSURE PLATE
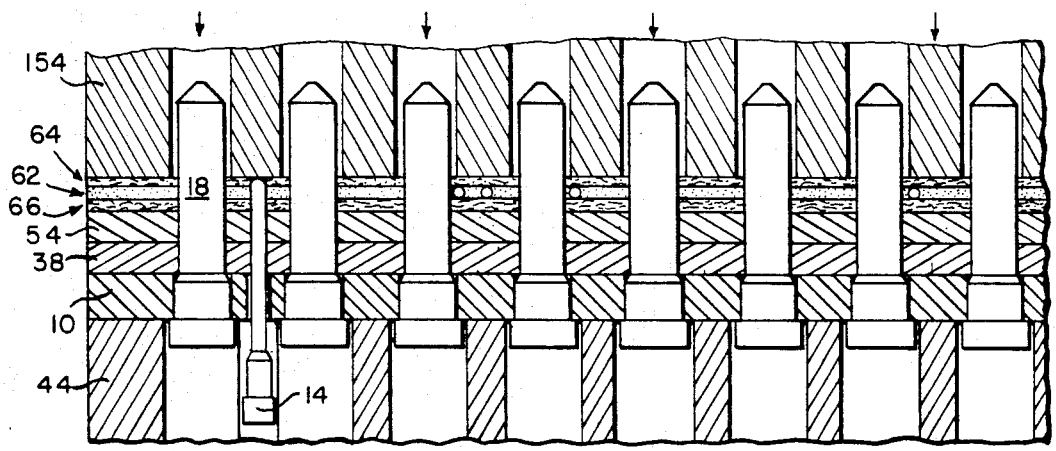
Fig. 19

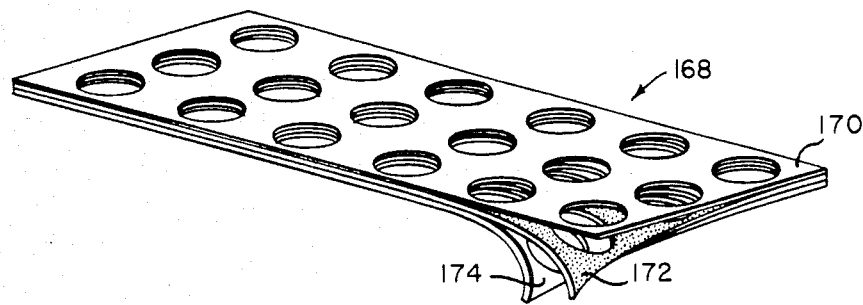
Fig. 23 SECOND MULTI-LAYERED SHEET
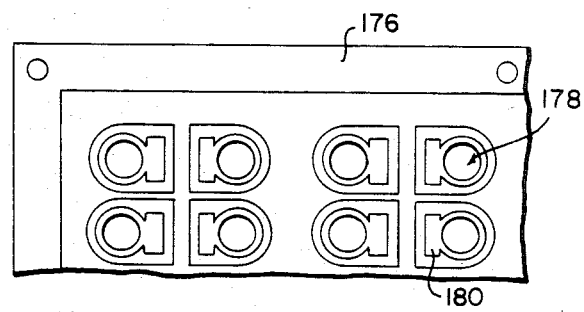
Fig. 24 CIRCUIT BOARD
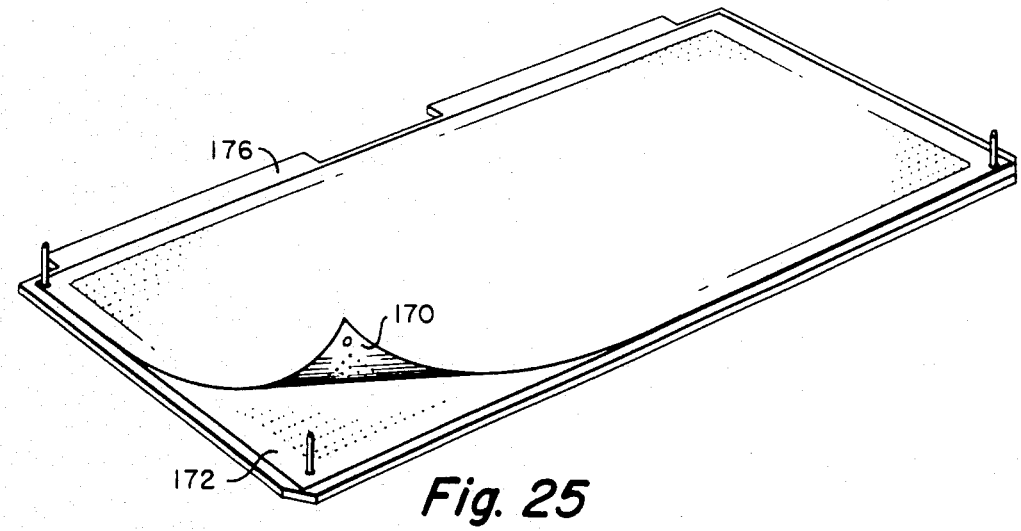
Fig. 25

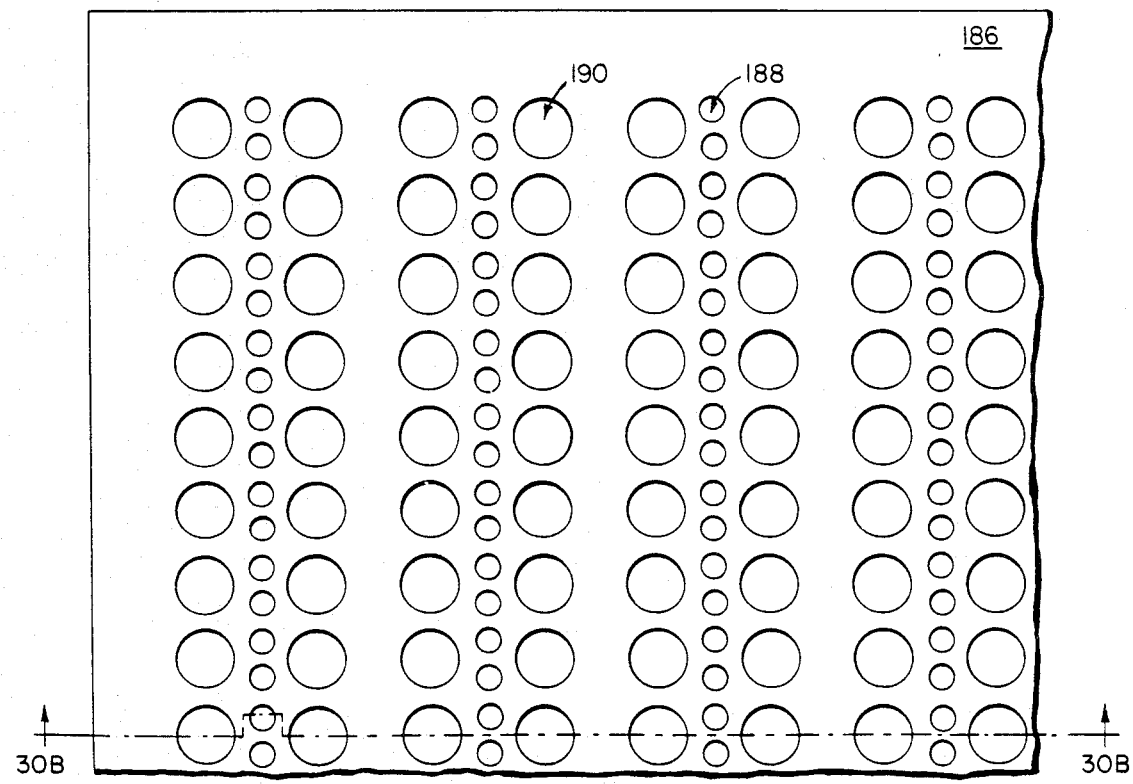
Fig. 30A FIRST FIXTURE PLATE
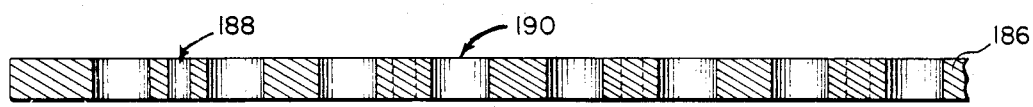
Fig. 30B
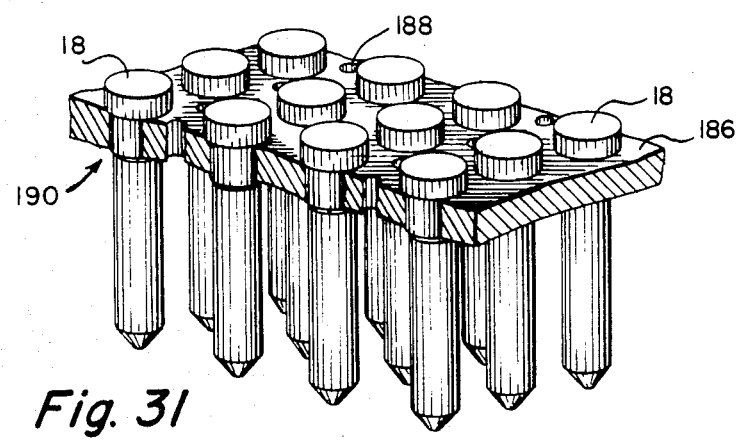
Fig. 31

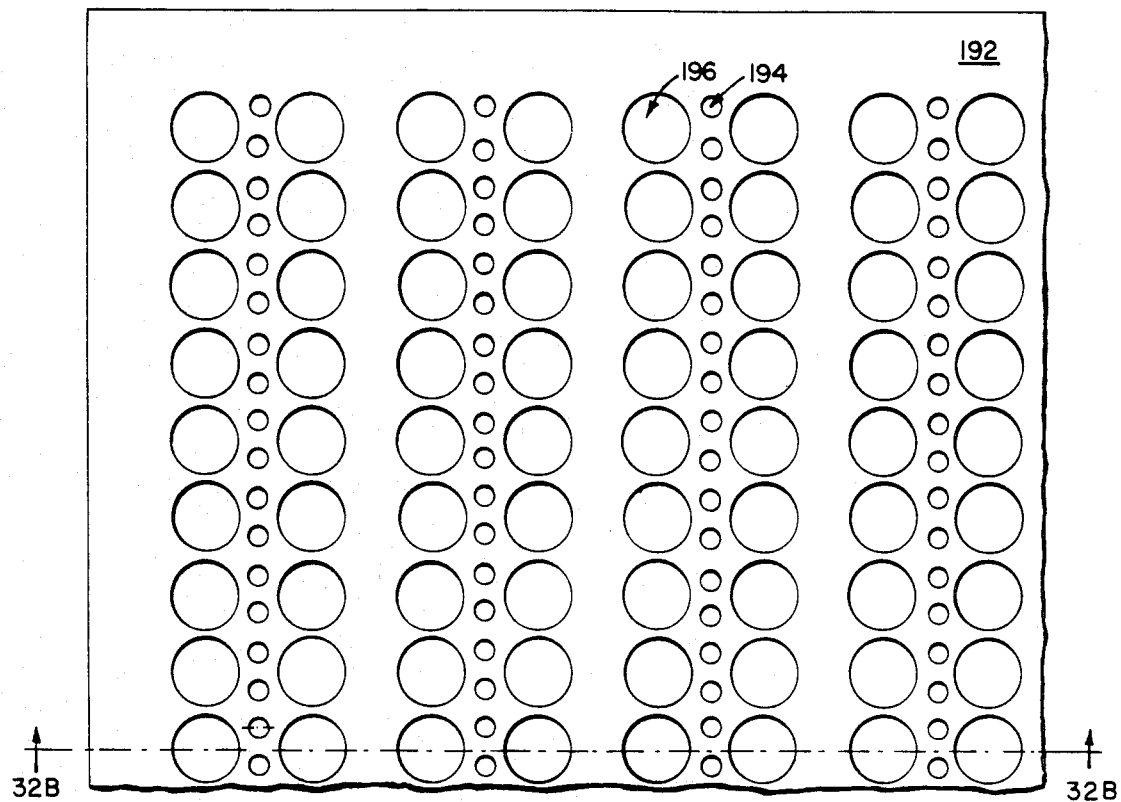
Fig. 32A SECOND FIXTURE PLATE
Fig. 32B
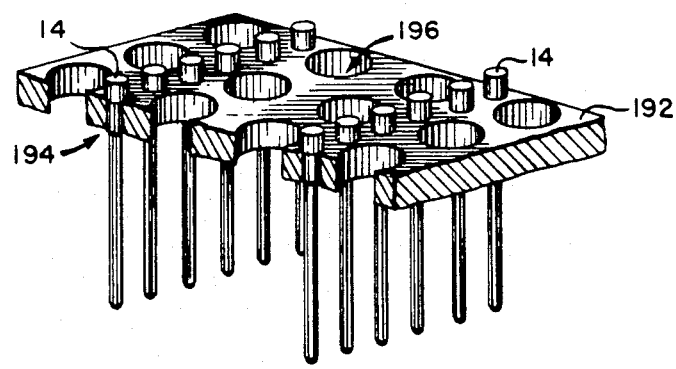
Fig. 33

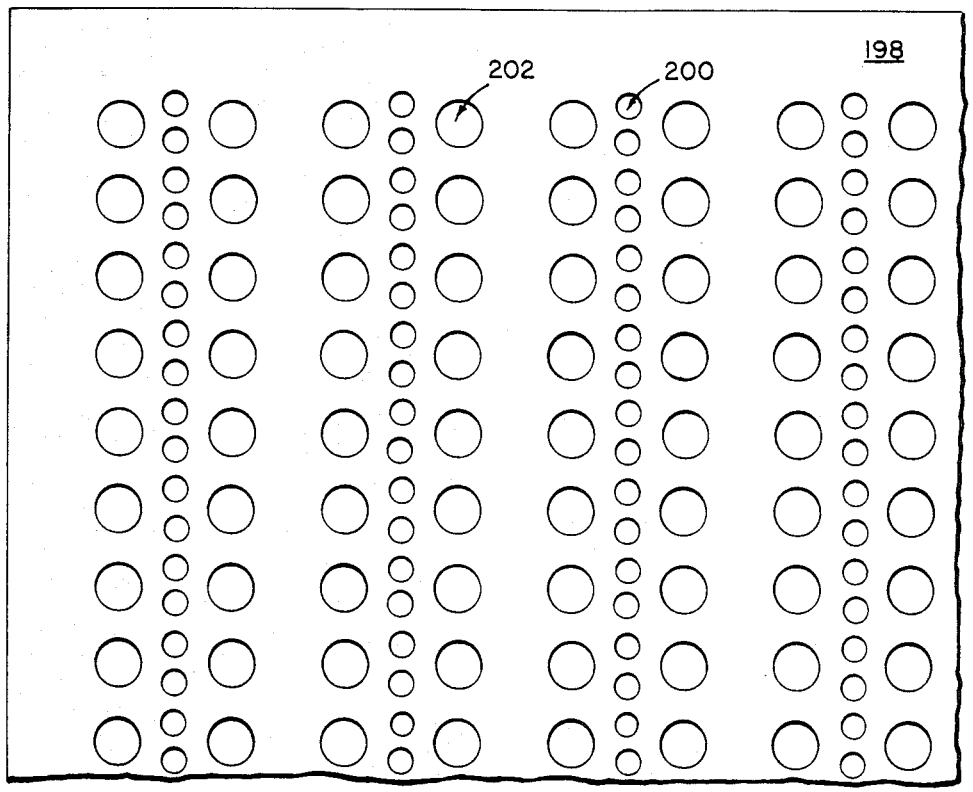
Fig. 34 A  PIN RETAINING PLATE
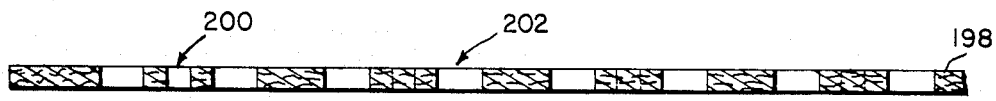
Fig. 34B
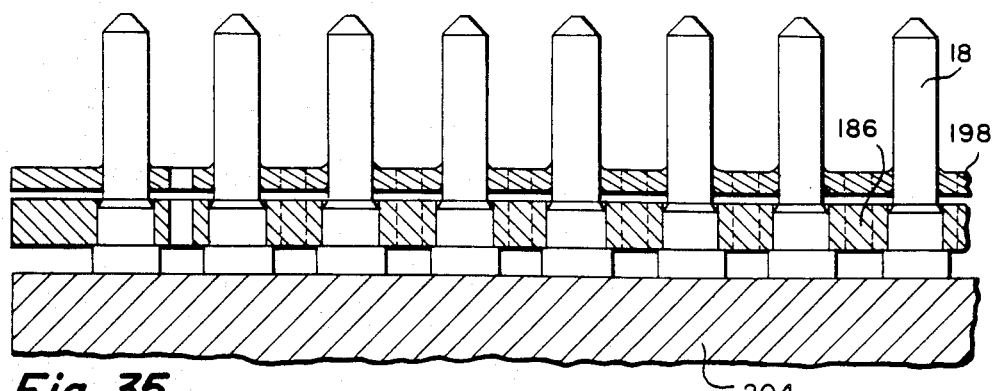
Fig. 35

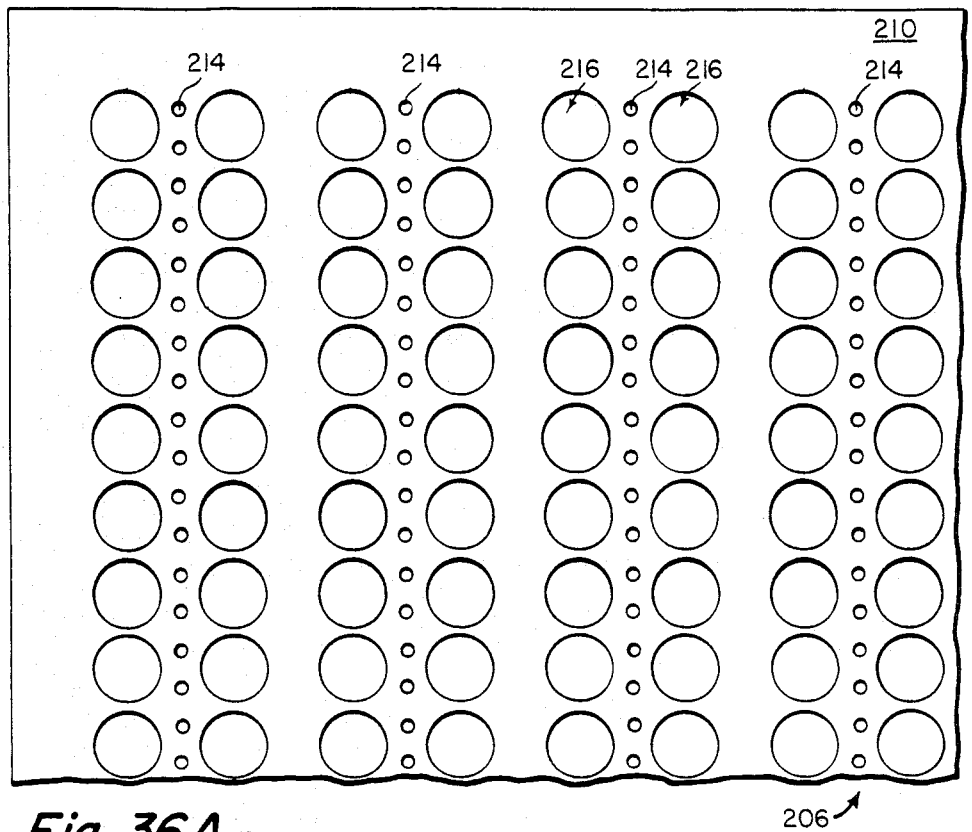
Fig. 36A FIRST MULTILAYERED SHEET
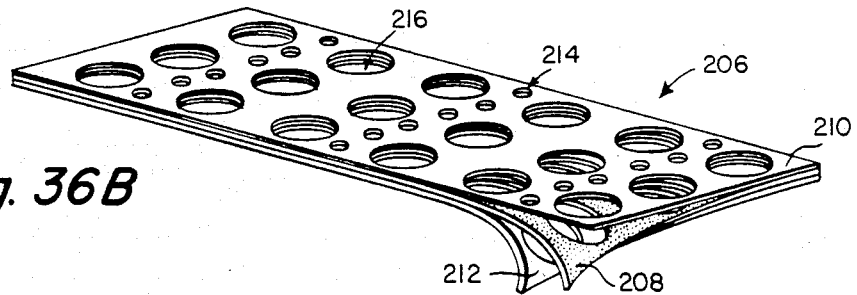
Fig. 36B
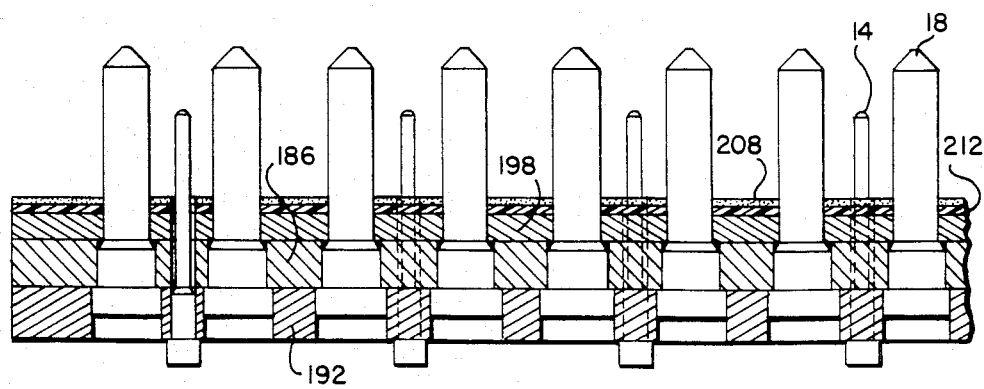
Fig. 37

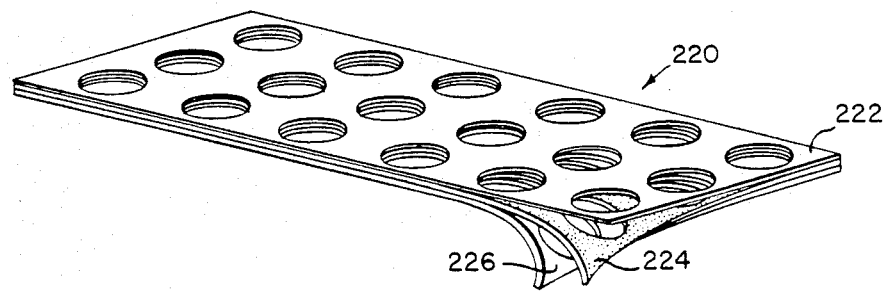
Fig. 39 SECOND MULTI-LAYERED SHEET
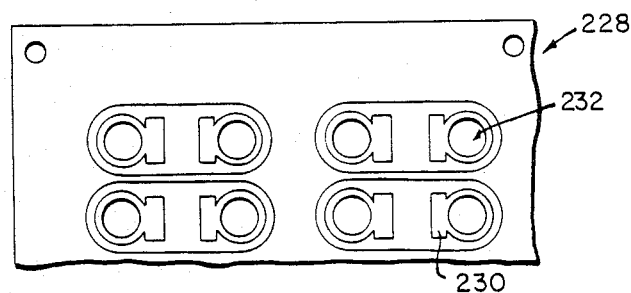
Fig. 40 CIRCUIT BOARD
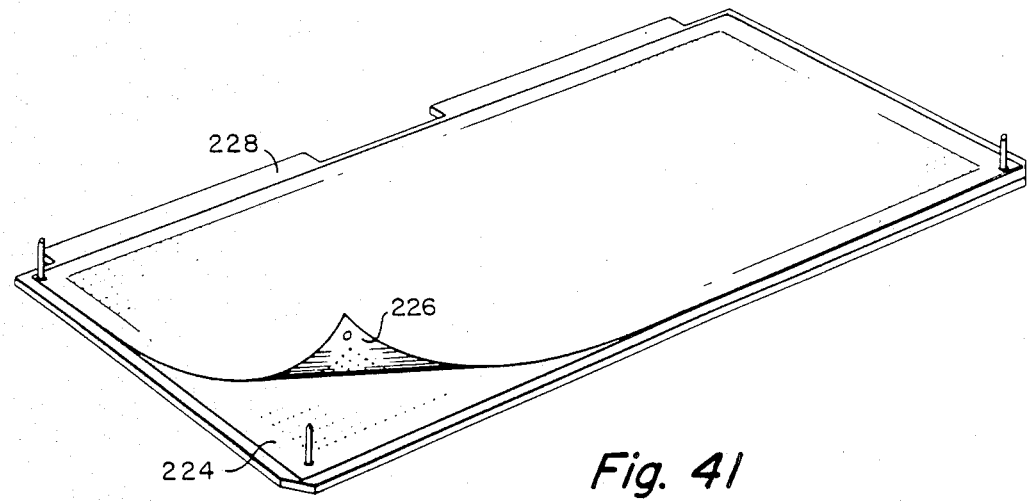
Fig. 41

METHOD OF PRODUCING A WIRED CIRCUIT BOARD

CROSS REFERENCE TO RELATED APPLICATIONS

This application is a continuation-in-part of application Ser. No. 549,484, filed on Nov. 4, 1983, and assigned to the same assignee as the instant invention.

FIELD OF THE INVENTION

This invention relates to circuit boards and more particularly circuit boards in which interconnections are produced by mating a wire mat with one or both sides of a circuit board having a defined conductive pad layout.

BACKGROUND OF THE INVENTION

Wired circuit boards employing discrete point to point wiring are often utilized when the volume of circuit boards to be produced does not warrant the production of etched printed circuit boards. Wired circuit boards employing discrete wiring are generally produced by connecting conductive pads on a circuit board with individual wires to form a desired interconnection pattern. Since wired circuit boards are generally produced with automated wire routing machinery, this process is particularly beneficial when it is desired to produce several prototype circuit boards or a limited number of circuit boards for production.

A number of methods are known for producing wired circuit boards. One such method is described in co-pending application Ser. No. 266,620 by the same inventor and assignee as the present invention. Therein disclosed is a method in which interconnecting wires are routed around guide pins upwardly projecting through a circuit board with wires soldered point to point as they are routed from a starting connection point to a final correction point. The routed wires connect selected conductive pads leaving predefined areas free of wiring. These areas are reserved for components such as dual-in-line integrated circuit packages. After completion of wire routing on the circuit board, a thermoplastic sheet is placed over the network of wires to adhere the wires to the circuit board.

Other methods of producing wired circuit boards are disclosed in U.S. Pat. Nos. 3,981,076; 3,842,190; 3,701,838; and 3,694,792.

SUMMARY OF THE INVENTION

In accordance with the present invention, a method is disclosed for producing a circuit board by routing a continuous wire along a predetermined path in a fixture, fixably positioning the continuous wire by adhering the wire to a thermoplastic adhesive layer, severing the wire at selected locations to form a plurality of wire nets defining an intended interconnection pattern, mating the wire nets thus formed with a circuit board having conductive pads disposed in a specified pattern on the board surface, and soldering selected points of selected wire nets to selected conductive pads.

A fixture plate is provided having a plurality of pins projecting therethrough and having apertures sized to slideably receive the pins. The pins are fixably positioned in the fixture plate by pressing a pin retaining plate having apertures sized for interference fit with the pins and coaxially aligned with apertures of the fixture plate over shanks of pins projecting through the fixture plate. A cutter backing plate is overlaid on the pin retaining plate and a thermoplastic adhesive layer is disposed above the cutter backing plate. A continuous wire is then routed along a predetermined path through the pins in accordance with defined routing conventions. Pressure is applied to the continuous wire to fixably position the wire on the underlying thermoplastic adhesive layer. The continuous wire, adhered to the adhesive layer, is next severed at selected locations to form a plurality of "wire nets". The "wire nets" referred to herein are individual segments of the continuous wire which are formed by severing the continuous wire at selected locations to create a plurality of separate wire segments along the path of the continuously routed wire.

A second thermoplastic adhesive layer is registered and adhered to a circuit board having a specified conductive pad pattern. The circuit board has a plurality of plated through pin socket receiving apertures intended to receive IC pin sockets or other electrical components. Conductive pads are disposed adjacent the pin socket receiving apertures for electrical interconnection therewith.

After registration and mating of the second thermoplastic adhesive layer to the circuit board, the circuit board is precisely aligned above the wiring fixture and compressive pressure is applied to the circuit board to urge the circuit board and second adhesive layer into adhered confronting relation with the first adhesive layer, thereby fixably locating the wire nets on the circuit board. Registration and mating of the wire nets to the circuit board in the above described manner assures that selected points of wire nets confront selected conductive pads on the surface of the circuit board.

The circuit board and adhered wire mat are removed from the fixture plate, a low durometer rubber sheet is overlaid on the first adhesive layer, and the circuit board and mat with overlaid rubber sheet are subjected to compressive pressure. This step causes the adhesive layers to conformally coat the wire nets and the circuit board. The circuit board with wires and adhesive adhered thereto is inserted into an oven and the thermoplastic adhesive material is cured at an elevated temperature. A solder flux is next applied to the circuit board and the board is transferred to an oven for a brief period of time to increase the viscosity of the flux. Wires confronting selected conductive pads on the circuit board are soldered to the pads to complete interconnection of the circuit board. The circuit board is finally cleaned via an ultrasonic cleaning process.

In another embodiment of the invention, a first fixture plate is provided having a first plurality of pins upwardly projecting through the fixture plate. The first plurality of pins are fixably positioned in the fixture plate by pressing a pin retaining plate having apertures sized for interference fit with the first plurality of pins and co-axially aligned with apertures of the first fixture plate, over the shanks of the pins upwardly projecting through the first fixture plate. A second fixture plate is provided having a second plurality of pins upwardly projecting through apertures sized to receive the second plurality of pins in an interference fit. The first fixture plate includes apertures selectively positioned and clearance sized for co-axial alignment over the second plurality of pins upwardly projecting through the second fixture plate. The first fixture plate is disposed over the second fixture plate such that the second plurality of pins upwardly projects through corresponding apertures of the first fixture plate. A thermoplastic adhesive sheet is disposed over the first and second pluralities of upwardly projecting pins and in confronting relation with the pin retaining plate. A continuous wire is then routed along a predetermined path through the respective pins in accordance with defined routing inventions. After wiring of the continuous wire through the upwardly projecting pins, the second fixture plate is separated and removed from the first fixture plate thereby withdrawing the second plurality of pins downwardly through respective apertures in the first fixture plate.

A second thermoplastic adhesive sheet is registered over and adhered to a circuit board having a specified conductive pad pattern. The circuit board with the adhesive sheet affixed thereto is registered above the first fixture plate such that the adhesive sheet adhered to the circuit board confronts the continuous routed wire. Force is applied to the circuit board to compress the circuit board and the second adhesive sheet adhered thereto into confronting relation with the continuous routed wire and underlying adhesive sheet and thereby affix the continuous wire to the circuit board. The circuit board with the continuous routed wire adhered thereto are removed from the first fixture plate, a low durometer rubber sheet is overlaid on the adhesive, and the circuit board, wire mat, and rubber sheet are subjected to compressive pressure to conformally coat the continuous routed wire and the circuit board with adhesive. The circuit board with wires and adhesive adhered thereto is next inserted into an oven and the thermoplastic adhesive material is cured at an elevated temperature for a specified period of time. Wires confronting selected conductive pads on the circuit board are next soldered to the pads to interconnect selected points of the continuous wire to selected pads of the circuit board. Following this soldering step, the continuous wire is severed employing a V-shaped displacement cutter or the equivalent thereof, thereby forming a plurality of segments of the continuous wire. These segments, or wire nets, formed by severance of the continuous wire, interconnect selected ones of the conductive pads on the circuit board in accordance with a predetermined interconnection pattern. Following the severing step, the wired circuit board produced in accordance with the present disclosure is cleaned by ultrasonically cleaning the board or by any other suitable cleaning technique.

A wire mat produced in accordance with the present disclosure may be provided on one or both surfaces of the circuit board.

BRIEF DESCRIPTION OF THE DRAWINGS

These and other features of the invention are more fully set forth in the solely exemplary detailed description and accompanying drawings of which:

FIG. 1A is a partial top view of a wiring fixture plate in accordance with the present invention;

FIG. 1B is a sectional side view of the wiring fixture plate of FIG. 1A;

FIG. 2A is a side elevation view of a delete pin slideably receivable in selected apertures of the wiring fixture plate;

FIG. 2B is a side elevation view of a guide pin slideably receivable in selected apertures of the wiring fixture plate;

FIG. 3 is a cutaway perspective view illustrating guide and delete pins loaded in respective apertures of the wiring fixture plate;

FIG. 4 is a sectional elevation view showing the fixture plate inverted and a bottom plate employed to retain the guide and delete pins within respective apertures;

FIG. 5 is a partial top view illustrating a pin retaining plate in accordance with the present invention;

FIG. 6 is a partial top view illustrating a clearance plate in accordance with the present invention;

FIG. 7 is a sectional elevation view illustrating the pin retaining plate disposed over guide and delete pins to frictionally maintain the pins in a normally vertical orientation;

FIG. 8 is a sectional elevation view illustrating the clearance plate substituted for the bottom plate;

FIG. 9 is a partial top view of the cutter backing plate employed in practicing the present invention;

FIG. 10 is a sectional side view showing the cutter backing plate disposed over guide and delete pins and in confronting relation with the pin retaining plate;

FIG. 11A is a top view of a first multilayered sheet comprising an adhesive layer and outer release layers;

FIG. 11B is a perspective view of the multilayered sheet of FIG. 11A with release and adhesive layers partially peeled away;

FIG. 18 is a partial top view of a pressure plate employed in practicing the present invention;

FIG. 19 is a sectional side view illustrating the application of compressive pressure to the continuous wire and underlying adhesive layer to adhere the wire to the layer;

FIG. 23 is a perspective view of a second multilayered sheet employed in accordance with the present invention;

FIG. 24 is a partial top view of a circuit board used in accordance with the present invention;

FIG. 25 is a perspective view illustrating the adhesion of the adhesive layer of the second multilayered sheet to the circuit board of FIG. 24;

FIG. 30A is a partial top view of a first fixture plate in accordance with the present invention;

FIG. 30B is a sectional side view of the wiring fixture plate of FIG. 30A;

FIG. 31 is a cut-away perspective view illustrating guide pins loaded in respective apertures of the first fixture plate;

FIG. 32A is a partial top view of a second fixture plate in accordance with the present invention;

FIG. 32B is a sectional side view of the second fixture plate of FIG. 32A;

FIG. 33 is a cut-away perspective view illustrating delete pins loaded in respective apertures of the second fixture plate;

FIG. 34A is a partial top view illustrating a pin retaining plate in accordance with the present invention;

FIG. 34B is a sectional side view of the pin retaining plate of FIG. 34A;

FIG. 35 is a sectional elevation view illustrating the pin retaining plate disposed over shanks of guide pins slideably disposed within the first fixture plate to frictionally maintain the pins in a normally vertical orientation;

FIG. 36A is a top view of a first multilayered sheet comprising an adhesive layer and outer release layers;

FIG. 36B is a perspective view of the multilayered sheet of FIG. 36A with release and adhesive layers partially peeled away;

FIG. 37 is a sectional elevation view illustrating the first fixture plate with guide pins vertically disposed and retained therein and disposed over the second fixture plate such that delete pin shanks extend through apertures provided in the first fixture plate;

FIG. 39 is a perspective view of a second multilayered sheet employed in accordance with the present invention;

FIG. 40 is a partial top view of a circuit board used in accordance with the present invention;

FIG. 41 is a perspective view illustrating the adhesive layer of the second multilayered sheet adhered to the circuit board of FIG. 40;

DETAILED DESCRIPTION OF THE INVENTION

Figure 12:
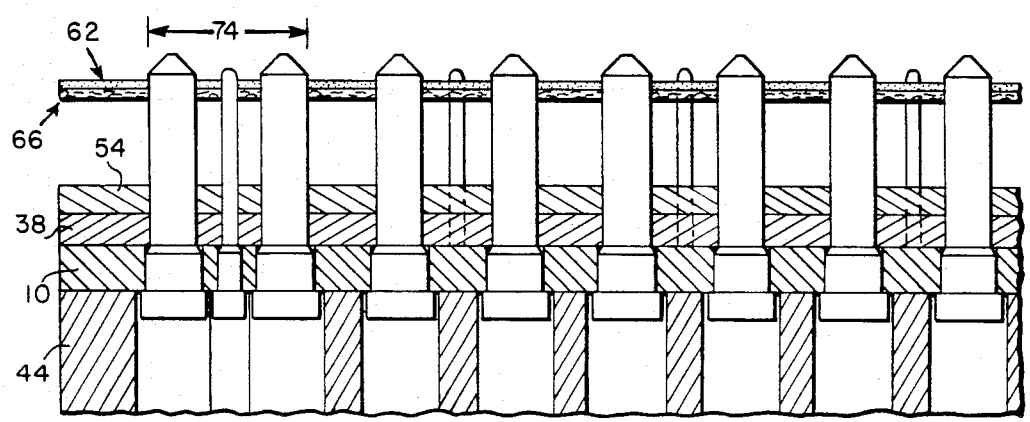
FIG. 12 is a sectional side view illustrating the addition of release and adhesive layers to the fixture plate.

In accordance with the present invention a method is disclosed in which a wire mat having a plurality of wire nets disposed on the mat in a predetermined routing pattern is produced and then mated with a circuit board having a defined conductive etch layout intended for use with the present method. This novel method for producing a wired circuit board comprises three major operations including a wire routing operation, a wire severing operation and a mating operation. The wire mat is produced by laying an adhesive layer over a fixture plate having upwardly projecting pins extending therethrough and then routing a continuous insulated wire along a predetermined path through the upwardly projecting pins. The continuous insulated wire is adhered to the underlying adhesive layer by application of compressive pressure. The continuous wire is then severed at selected locations in a cutting operation to produce a plurality of wire nets fixed in position by the adhesive sheet. A second adhesive layer is adhered to a circuit board having a defined conductive pad layout. Apertures are provided in the second adhesive layer in a pattern corresponding to the location of guide pins in the fixture. Apertures in the circuit board are plated through and sized to receive integrated circuit or other pin sockets. Conductive pads provided on the circuit board are located adjacent each pin socket aperture and are electrically connected thereto.

The printed circuit board is precisely registered over the wiring fixture plate such that centers of guide pins coaxially align with centers of integrated circuit pin socket receiving apertures. The circuit board and fixture are subjected to compressive pressure thereby forcing the adhesive layer adhered to the circuit board into confronting adhesive contact with the wire nets and underlying adhesive layer. As a consequence of wiring in accordance with presently disclosed wiring conventions, selected points of the wire nets confront selected conductive pads. The circuit board and wire mat are removed from the fixture and the adhesive layers are cured by heating the adhesive layers at a predetermined temperature for a defined period of time. Wires confronting selected conductive pads are then soldered to the pads in a solder reflow operation to interconnect selected ones of the integrated circuit pin socket receiving apertures, thereby completing interconnection of the circuit board.

The circuit board presently disclosed has an identical conductive pad pattern on both sides of the board thereby permitting single sided or double sided wire mat circuit boards to be produced in accordance with this method.

Referring to FIGS. 1A through 29B, the continuous insulated wire is routed on a fixture of the type illustrated in FIGS. 1A and 1B. Typically, a plurality of identical fixtures of the type shown are mounted on an X-Y axis table, and a routing head feeds a continuous wire through corresponding pins of each fixture with X-Y axis table movement numerically controlled. By ganging fixtures on a single X-Y axis table, several identical wire mats may be simultaneously produced thereby improving overall process efficiency and reducing the cost of circuit board production.

The wiring fixture plate 10 employed in practicing the present invention includes apertures 12 sized to slideably receive delete pins 14, illustrated in FIG. 2A, and apertures 16 sized to slideably receive guide pins 18 illustrated in FIG. 2B. Guide pin apertures 16 are disposed in rows and columns in a repetitive pattern of desired size. As shown in FIG. 1A, apertures 16 for guide pins 18 are disposed in columns A, C, D, F, G . . . and have a fixed inter-column spacing. In a preferred embodiment of the invention the inter-column spacing is 0.150 inch. Guide pin apertures 16 of the wiring fixture plate 10 have a fixed inter-row spacing which in a preferred embodiment of the invention is 0.1 inch on centers, corresponding to the inter-pin spacing of typical dual-in-line integrated circuit devices. Delete pin apertures 12 are disposed between adjacent columns of guide pin apertures, however, delete pin apertures 12 are located only between alternating adjacent guide pin columns. Thus, as seen in FIG. 1A, delete pin apertures 12 in column B are disposed between adjacent guide pin apertures 16 of columns A and C, and delete pin apertures 12 of column E are disposed between adjacent guide pin apertures 16 of columns D and F. Delete pin apertures 12 are disposed equi-distant above and below row center lines 1, 2, 3 . . . In a preferred embodiment of the invention, the delete pin apertures 12 are disposed midway between guide pin columns, as previously indicated, and delete pin apertures 12 are located 0.025 inch above and below each row center line. Thus in the embodiment having inter-row spacings of 0.1 inch on centers, delete pin apertures have a fixed inter-pin spacing of 0.050 inch. In the illustrated embodiment, guide pin apertures 16 have a diameter of 0.076 inches and delete pin apertures 12 have a diameter of 0.036 inches. The wiring fixture plate is typically fabricated of a hard flat material such as metal, epoxy, or plastic or any other suitable material, and is presently illustrated as having a thickness of approximately 0.062 inch.

Delete pins 14 have a head portion 20 of a first diameter, a shoulder portion 22 of a second diameter less than the first diameter and a shank portion 24 of a diameter less than the shoulder 22. The overall length of the delete pin 14 is 0.323 inch with the head portion of length 0.030, the shoulder portion of length 0.057 inch, and the shank 24 portion of length 0.236 inch in a preferred embodiment. In this preferred embodiment, the diameter of the shoulder portion 22 is 0.033 inch, and the diameter of the shank portion 24 is 0.018 inch. The delete pin 14 shoulder portion 22 is thus slideably receivable in wiring fixture plate 10 apertures 12.

The guide pin 18 shown in FIG. 2B, includes a heat portion 26 of a first diameter, a shoulder portion 28 of a second diameter less than the first diameter and a shank portion 30 of a third diameter less than the shoulder 28 diameter. As illustrated, ends 32 of the guide pins 18 are provided with a chamfer for reasons which will subsequently be appreciated. In the illustrated embodiment, the head portion 26 of guide pins 18 has a 0.078 inch diameter, the shoulder portion 26 has a 0.073 inch diameter and the shank portion 30 has a 0.065 inch diameter. The overall length of the guide pins is 0.353 inch. The head portion 26 of the guide pin 18 is 0.030 inch in length, the shoulder portion 28 being 0.055 inch in length and the shank being 0.268 inch in length. The shoulder portion 28 of the guide pin 18 is sized to be slideably receivable within guide pin apertures 18 of the wiring fixture plate 10.

As illustrated in FIG. 3, delete pins 14 and guide pins 18 are slideably disposed within respective delete pin apertures 12 and guide pin apertures 16 of the fixture plate 10 such that shanks of the respective pins project from a wiring surface 34 of the fixture plate 10. Head portions 20 and 26 of respective delete and guide pins 14 and 18 are of diameters larger than the respective pin receiving apertures of the fixture plate 10 and thereby maintain the pins in fixed normally vertical orientation following insertion in respective pin apertures. The fixture plate 10 may be populated with delete pins 14 and guide pins 18 by manually inserting pins into appropriate receiving apertures of the plate or alternatively via any suitable automated loading technique. In one such technique, a mask is placed over guide pin apertures 16, delete pins are disposed over the mask, and the fixture plate is vibrated causing delete pins to populate delete pin apertures. Delete pins are maintained in position by a vacuum source applied to the wiring surface 34 of the fixture plate 10. The mask is removed, guide pins are disposed above the fixture plate 10, and the fixture plate is again vibrated to populate guide pin apertures 16. Any appropriate technique for populating the fixture plate 10 with guide pins 18 and delete pins 14 may be employed to accomplish this pin loading step.

In a fixture plate inverting step, a bottom plate 36 is applied over the head portions of guide pins 18 and delete pins 14 to capture the head portions of the pins between the bottom plate 36 and the fixture plate 10, and the fixture plate 10 is inverted to assume the orientation illustrated in FIG. 4. The bottom plate may be any suitably sized material having a flat head confronting surface. Such materials as one quarter inch G-10 epoxy or metal may be suitably employed for fabrication of the bottom plate 36.

A pin retaining plate 38 having apertures with centers correspondingly located with the apertures of the wiring fixture plate 10 is disposed over shanks of delete pins 14 and guide pins 18 to maintain the pins in fixed vertical position within the wiring fixture plate 10. The pin retaining plate 38 has guide pin apertures 40 and delete pin apertures 42 sized for interference fit with the shanks 30 of guide pins 18 and shanks 24 of delete pins 14, respectively. The pin retaining plate 38 is registered over the fixture plate 10 such that guide pin apertures 40 and delete pin apertures 42 coaxially align with the shanks of the respective guide and delete pins. In the present embodiment, guide pin apertures 40 of the pin retaining plate 38 have a diameter of 0.062 inch and delete pin apertures 42 of the pin retaining plate 38 have a diameter of 0.016 inch. The pin retaining plate is fabricated of a resilient material, such a chipboard and is presently shown to be approximately 0.030 inch in thickness.

A clearance plate 44, such as that illustrated in FIG. 6, having apertures with centers correspondingly located with the centers of apertures of the wiring fixture plate 10 has guide pin apertures 46 and delete pin apertures 48 sized for clearance fit over respectively guide pin 18 shanks 30 and delete pin 14 shanks 24. The clearance plate is fabricated of a hard material having flat surfaces such as metal or G-10 epoxy and in the present embodiment is shown to be approximately 0.250 inch in thickness. Guide pin apertures 46 in the illustrated embodiment are 0.085 inch in diameter and delete pin apertures 48 are 0.045 inch in diameter.

As illustrated in FIG. 7, the pin retaining plate 38 is coaxially aligned with guide pin and delete pin apertures over respective guide pin and delete pin shanks, and the clearance plate 44 is correspondingly positioned above the pin retaining plate 38. A compressive pressure is applied to the clearance plate 44 to urge the pin retaining plate 38 into confronting relation with the fixture plate 10. Since the guide pin apertures 40 and delete pin apertures 42 of the pin retaining plate 38 are of diameters smaller than the shanks of respective guide pins 18 and delete pins 14, the pin retaining plate 38 aperture walls frictionally engage the shanks of the respective pins and maintain the pins in a fixed vertical orientation within the fixture plate. Since the clearance plate 44 has guide pin apertures 46 and delete pin apertures 48 of diameters greater than respective guide pins 18 and delete pins 14, upon application of compressive pressure to the clearance plate 44, the plate 44 slides freely downward over the respective shanks under compressive pressure, and is readily removed once the pin retaining plate 38 is in confronting relation with the wiring fixture plate 10.

In a next operation the bottom plate 36 is removed from confronting relation with the heads of delete pins 14 and heads of guide pins 18, and the clearance plate 44 is disposed below the fixture plate 10 such that guide pin apertures 46 and delete pin apertures 48 of the clearance plate 44 are in coaxial alignment with respective guide pin apertures 16 and delete pin apertures 12 of the wiring fixture plate 10. Since the head 26 of guide pins 18 and the heads 20 of delete pins 14 are of diameters less than respective apertures of the clearance plate 44, the heads of guide pins 18 and delete pins 14 are slideably received within respective apertures of the clearance plate 44, as illustrated in FIG. 8. Frictional engagement of guide pin aperture walls 50 and delete pin aperture walls 52 of the pin retaining plate 38 with respective guide and delete pin shanks retains the pins in the fixture plate 10 after substitution of the clearance plate 44 for the bottom plate 36 subjacent the wiring fixture plate 10. A cutter backing plate 54 having guide pin apertures 56 and delete pin apertures 58 with centers correspondingly located with the centers of guide pin apertures 16 and delete pin apertures 12 of the wiring fixture plate 10 is slideably disposed over guide pins 18 and delete pins 14 and in confronting relation with the pin retaining plate 38, as illustrated in FIG. 10. Guide pin apertures 56 and delete pin apertures 58 of the cutter backing plate 54 are sized for clearance fit over guide pin shanks 30 and delete pin shanks 40 of the respective pins. In the present embodiment, the diameter of the guide pin apertures 56 is 0.072 inch and the diameter of delete pin apertures 58 is 0.020 inch.

In a next operation, a first multilayered sheet 60 comprising an adhesive layer 62, an upper release layer 64 and a lower release layer 66 are slideably disposed on the fixture in confronting relation with the cutter backing plate 54 after peelably removing the upper layer 64 from the adhesive layer 62. The adhesive layer 62 comprises a thermoplastic adhesive material such as nitrite phenolic or any other suitable thermoplastic adhesive material. Prior to application of the first multilayered sheet 60 to the fixture, the sheet is pre-drilled as illustrated in FIGS. 11A and 11B. The upper release layer 64 and the lower layer 66 of the multilayered sheet 60 are typically fabricated of a release paper impregnated with a wax-like material to permit peelable removal of the respective layers from the adhesive layer 62. The upper release layer 64 is treated with a release agent which reduces adhesion of the layer 64 to the adhesive 62. Since the lower release layer 66 is not treated with a release agent, upon peeling, the upper release layer 64 readily separates from the adhesive layer 62 leaving the adhesive layer 62 and the lower release layer 66 in adhesive contact. Typically, a plurality of first multilayered sheets 60 are pre-drilled in stacked relationship to improve overall process efficiency.

Figure 13:
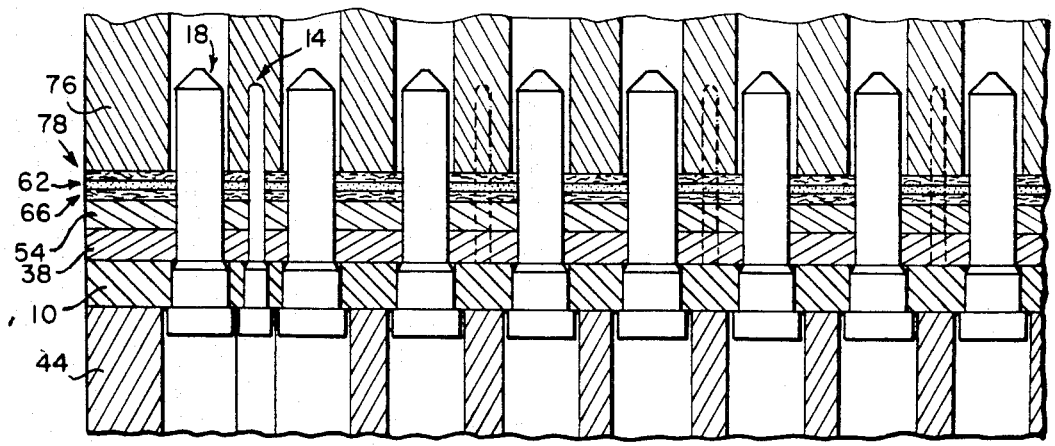
FIG. 13 is a sectional side view illustrating flattening of the adhesive and release layers into confronting relation with the cutter backing plate.

The first multilayered sheet 60 includes guide pin apertures 68 and delete pin apertures 70, with delete pin apertures 70 disposed between alternating adjacent columns of guide pins apertures 68. The inter-column spacing between guide pin apertures 68 and intermediate delete pin apertures 70, such as the spacing between columns A and C or D and F is 0.120 inch in the illustrated embodiment. The on center inter-column spacing of other adjacent guide pin apertures 62, such as between columns C and D or F and G is 0.180 inch as presently shown. Delete pin apertures 70 are illustrated as being 0.021 inch in diameter and are located on centers corresponding to center locations of delete pin apertures 12 of the wiring fixture plate 10. Guide pin apertures 68 of the first multilayered sheet 60 are 0.090 inch in diameter. Thus, the lateral distance 72 between outer extremeties of guide pin aperture 68 pairs in columns A and C, D and F, etc. is 0.210 inch. The lateral distance 74 between the outer extremeties of corresponding guide pins 18 is 0.215 inch. As illustrated in FIG. 12, after peelable removal of the upper release layer 64 from the adhesive layer 62 of the first multilayered sheet 60, the lower release layer 66 and the adhesive layer 62 are slideably disposed over the shanks of guide pins 18 and delete pins 14 such that the lower release layer 66 is in confronting relation with the cutter backing plate 54. Since the distance 72 is less than the distance 74, an interference occurs between the multilayered sheet 60 and guide pins 18 as the lower release layer 66 and the adhesive layer 62 are slideably disposed over the guide pin shank 30 and delete pin shank 24. The pliable nature of the release layer 66 and adhesive layer 62 permit these layers to be urged into confronting relation with the cutter backing plate 54 as illustrated in FIG. 13. To assure that the release layer 66 and adhesive layer 62 are in planar confronting relation with the cutter backing plate 54, a clearance plate 76 having a release layer 78 bonded to the adhesive confronting surface of the plate 76 is slideably disposed over the shanks of delete pins 14 and guide pins 18 and a light compressive pressure is applied. The presence of the release layer 78 permits removal of the clearance plate 76 from the fixture after this pressure application step without adhesion of the adhesive layer 62 to the plate 76. After removal of the clearance plate 76 and the release layer 78 bonded thereto, the fixture is appropriately configured for routing of the continuous wire in accordance with the present invention.

Figure 14:
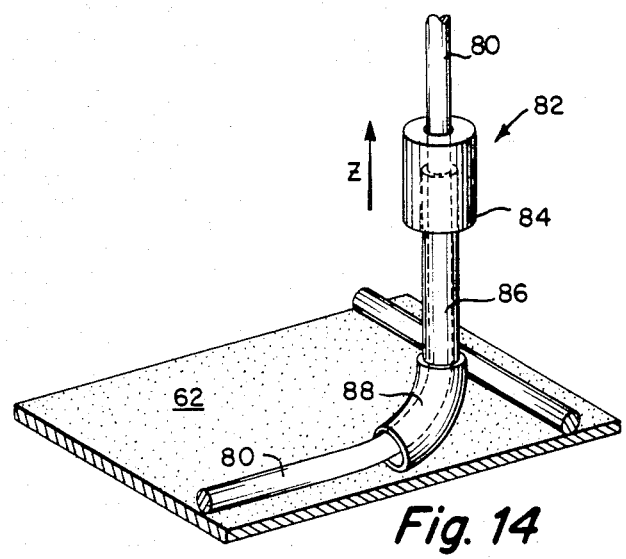
FIG. 14 is a perspective view of a wiring head employed in accordance with the present invention.

A continuous wire 80 is routed along a predetermined path under tension and in confronting relation with selected guide pins 18 and delete pins 14 employing a routing head 82 of the type illustrated in FIG. 14. A routing head 82 of the type shown is provided for each fixture to have a continuous wire 80 routed. The routing head 82 is capable of Z axis movement only, and routing of the continuous insulated wire 80 occurs as an X-Y axis table supporting one or more fixtures moves subjacent the routing head 82 under numerical control. Any equivalent means to achieve the above-described relative head and fixture movement may be substituted for the illustrated technique.

The routing head 82 included a bushing 84 having a bore sized to receive a tubular steel member 86. The illustrated head includes a tubular member 86 with an outer diameter of approximately 0.020 inch and an inner diameter of approximately 0.010 inch, permitting free passage of the continuous wire 80 through the member 86. A flexible tubular member 88 is concentrically affixed to the tubular member 86 as illustrated in FIG. 14. The flexible tubular member 88 permits routing of the continuous wire 80 just above the adhesive layer 62 and allows flexure in the event the member 88 traverses a previously routed segment of the continuous wire 80.

Figure 15A:
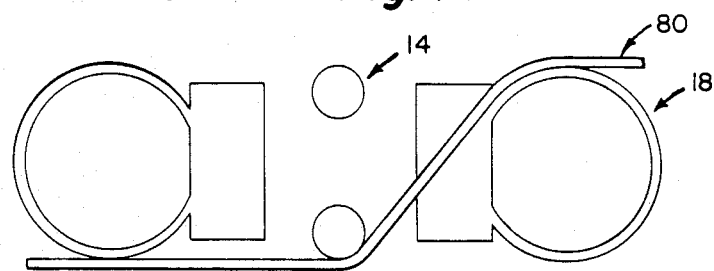
FIGS. 15A–15D are schematic views illustrating wiring conventions in accordance with the present invention.
Figure 15B:
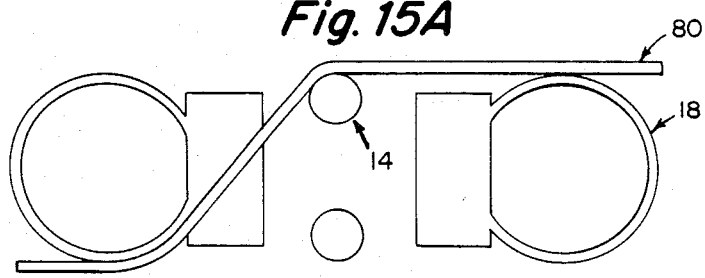
Figure 15C:
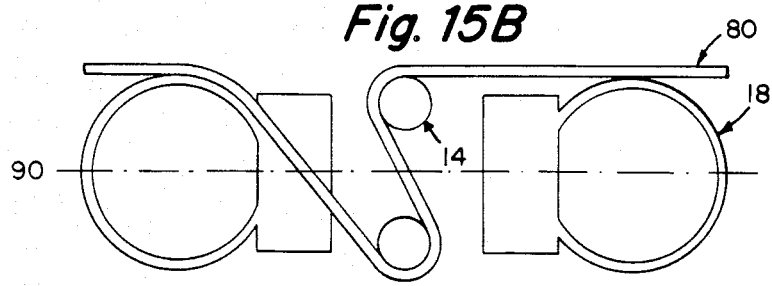
Figure 15D:
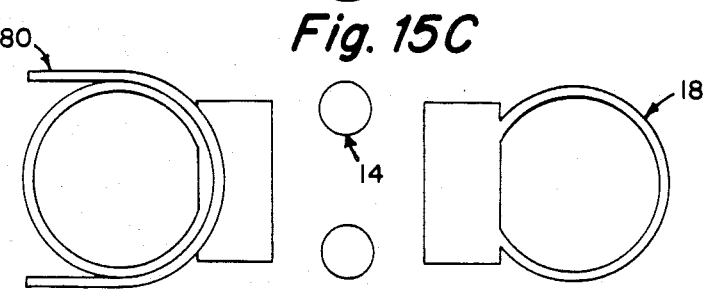
Figure 16A:
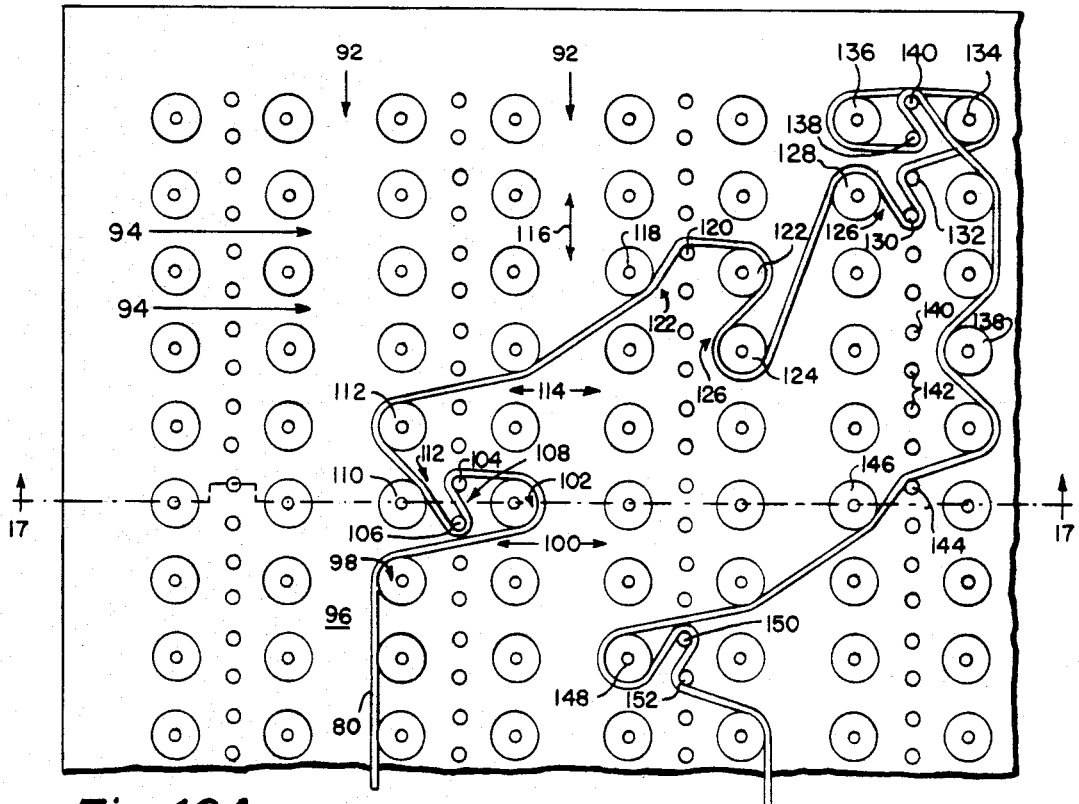
FIG. 16A is a top schematic view illustrating routing of the continuous wire on the wiring fixture plate along a predetermined path through selected guide and delete pins.
Figure 16B:
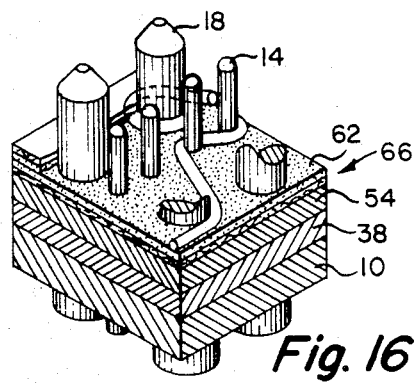
FIG. 16B is a cutaway perspective view illustrating routing of the continuous wire in accordance with the present invention.

Routing of the continuous wire 80 is performed in accordance with defined routing conventions illustrated schematically in FIGS. 15A through 15D, and in wiring examples shown in FIGS. 16A and 16B. The routing conventions assure that the wire 80, after routing and mating with a circuit board in accordance with this method, will confront selected conductive pads provided on the circuit board. Shanks of guide pins 18 and delete pins 14 serve designated functions in the routing process and in combination define intended locations of interconnection, intended locations of wire severance, and permissible wire routing channels.

Intended interconnection locations are defined by wire routing paths in which the continuous wire 80 passes diagonally between a guide pin 18 and a delete pin 14 as illustrated in FIGS. 15A and 15B. Alternatively, an intended interconnection location is defined by wire 80 travel around an arc of the guide pin 18 adjacent delete pins 14, as shown in FIG. 15D. Wire 80 routing between a pair of delete pins 14 disposed above and below a row centerline 90 in the manner illustrated in 15C defines an intended location of wire 80 severance between the respective delete pins 14. The wire 80 may be routed freely without interconnection or severance between vertical channels 92 or horizontal rows 94, illustrated in FIG. 16A. The continuous wire may be routed only once through each intended interconnection location.

These routing conventions will be further understood by reference to the purely illustrative example provided below.

ROUTING EXAMPLE

Referring to FIG. 16A, routing of the continuous wire 80 is initiated after anchoring the wire 80 at the edge of the fixture. A continuous wire 80 is routed through vertical channel 96 in confronting relation with guide pin 98 and then through horizontal row 100 to guide pin 102. The wire 80 passes diagonally between delete pins 104 and 106 defining a first location of wire severance 108 between delete pins 104 and 106. The wire 80 is then routed diagonally between delete pin 106 and guide pin 110 defining an intended first point of interconnection 112 adjacent guide pin 110. The wire 80 is then routed in confronting relation with guide pin 112 through horizontal row 114, vertical channel 116 and in confronting relation with guide pin 118. The wire 80 is then routed diagonally between guide pin 118 and delete pin 120 defining a second point of interconnection 122 adjacent guide pin 118 in this first wire net. The wire 80 is then routed around guide pin 122 and guide pin 124 defining a third intended location of interconnection 126 adjacent guide pin 124. A fourth intended location of interconnection 126 is defined by routing of the wire 80 in confronting relation with guide pin 128 and diagonally between guide pin 128 and delete pin 130. The wire is routed diagonally between delete pins 130 and 132 thereby defining an intended location of wire severance completing points of intended interconnection in this first wire net. The wire 80 is then routed around guide pin 134, guide pin 136 and diagonally between delete pin 138 and 140 defining an intended location of wire severance. The wire is next routed adjacent guide pin 134 defining a first point of intended wire interconnection in a second wire net. A second point of intended wire interconnection is obtained by routing the wire 80 around guide pin 138 along the segment of the guide pin circumference adjacent delete pins 140 and 142. A third point of wire interconnection is achieved by routing the wire 80 diagonally between delete pin 144 and guide pin 146, and a final point of wire 80 interconnection in this second wire net is achieved by routing the wire 80 in confronting relation with guide pin 148 and diagonally to delete pin 150. The wire is routed between delete pins 150 and 152 defining an intended location of wire severance between these delete pins and finally the wire 80 is routed to the perimeter of the fixture where it is anchored.

Figure 17:
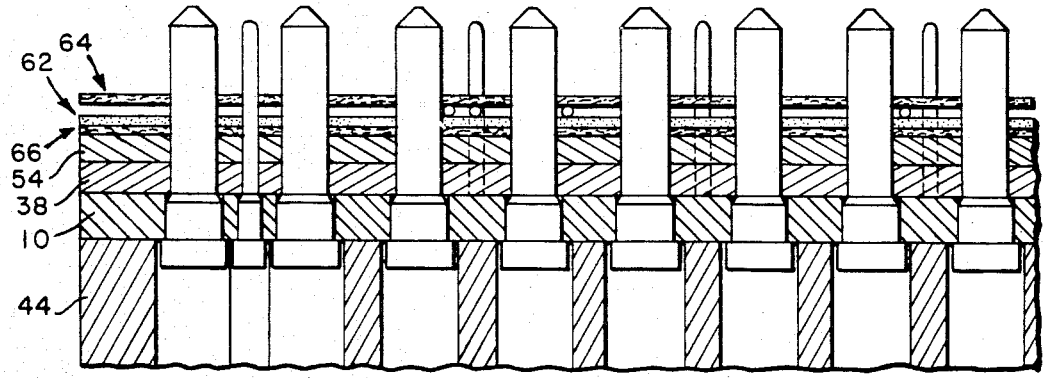
FIG. 17 is a sectional side view illustrating the addition of a release layer over the continuous routed wire.
Figure 21:
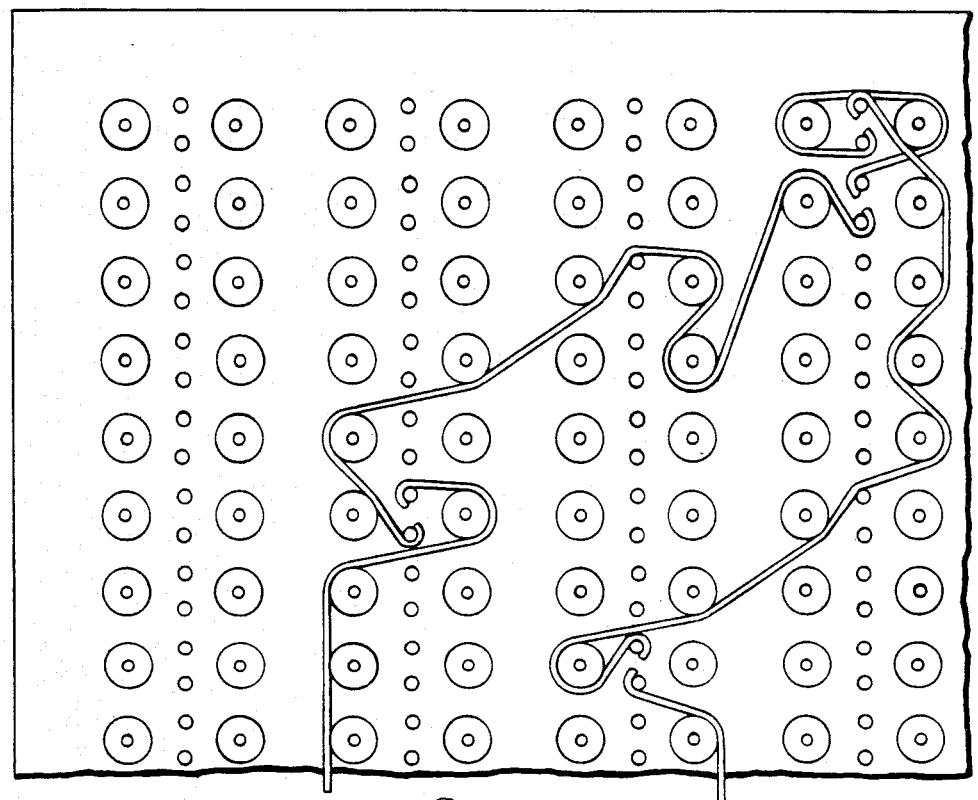
FIG. 21 is a top schematic view illustrating wire nets following severance of the continuous wire with the cutting head of FIG. 20.

After routing of the continuous wire 80 along a predetermined path in accordance with defined wiring conventions, the upper release layer 64 which was previously peelably removed from the adhesive layer 62 of the first multilayered sheet is slideably disposed over shanks of respective guide pins and delete pins and in confronting relation with the continuous routed wire 80, as illustrated in FIG. 17. A pressure plate 154 illustrated in FIG. 18 and having guide pin apertures 156 on centers corresponding to centers of guide pin apertures 16 of the wiring fixture plate 10 is disposed above the guide pins such that guide pin apertures 156 coaxially align with shanks of guide pins 18. It is noted that the pressure plate 154 includes no corresponding apertures for the delete pins 14. After coaxial alignment of the pressure plate 154 over the fixture plate 10, a compressive pressure is applied to the fixture plate 10 and pressure plate 154 thereby adhering the continuous wire 80 to the underlying adhesive layer 62 while slideably urging delete pins 14 downward into delete pin apertures 48 of the clearance plate 44 disposed below the fixture plate 10. The pressure plate 44 is thereupon removed preparatory to the severing operation.

Figure 20:
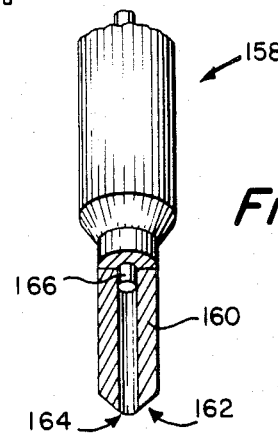
FIG. 20 is a cutaway perspective view of a cutting head in accordance with the present invention.

The continuous wire 80 is next severed to form a plurality of wire nets using a cutting head 158 of the type illustrated in FIG. 20. The cutting head 158 has a tubular barrel 160 tapered at an end 162 and defining a circular cutting edge 164. The cutting edge 164 in the presently illustrated embodiment is of 0.035 inch diameter. A pneumatically operated stipper pin 166 is located within the bore of tubular barrel 160.

The cutting head 158 is vertically disposed with respect to the wiring fixture plate 10 and is adapted for Z axis movement. Plural cutting heads 158 may be disposed above a number of wiring fixture plates 10 thereby permitting simultaneous severance of the wires 80 in each of a plurality of fixtures. The wiring fixture plate 10 is disposed on an X-Y axis table which moves under automated numerical control to position the fixture plate 10 such that an intended location of wire 80 severance is precisely aligned subjacent the cutting edge 164 of the cutting head 158. The cutting head 158 is actuated for downward movement and the cutting edge 164 of the barrel 160 impacts the layers disposed on the fixture, stamping out a circuit section of release paper 64, wire 80, adhesive 62, release paper 66, and a plug from the cutter backing plate 54. After severance of the wire 80, the cutting head 158 retracts vertically to a position above the severed wire 80 location. The stripper pin 166 is thereupon actuated for axial movement in the bore of the barrel 160 to eject waste material disposed in the bore as a consequence of the severing operation. Typically, a source of vacuum is disposed adjacent the cutting head 158 for removal of the waste material after ejection from the bore of the barrel 160 by stripper pin 166. The wire 80 is severed in the above manner at all intended location of wire severance thereby forming a wire mat including a plurality of wire nets. The continuous wire 80 illustrated in the wiring example of FIG. 16A is shown following the severing operation in FIG. 21.

Figure 22:
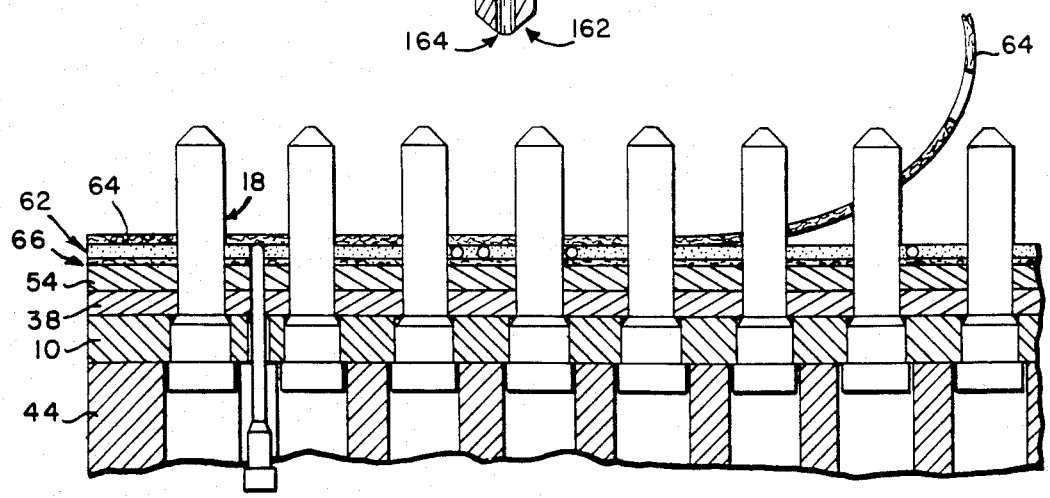
FIG. 22 is a sectional side view illustrating delete pins downwardly depressed into the pressure plate and showing peelable removal of the upper release layer.

Following the severing operation, the release layer 64 is peelably removed from the adhesive layer 62 as shown in FIG. 22.

In accordance with the present method, a second multilayer sheet 168 comprising an upper release layer 170, an adhesive layer 172 and a lower release layer 174 is precisely registered above a circuit board in accordance with the present invention, and the adhesive layer 172 is adhered to the circuit board 176 following peelable removal of the lower release layer 174 of the sheet 168. The second multilayer sheet includes guide pin apertures 175 having center locations and diameters identical to those of the first multilayered sheet 60. It is noted that the second multilayer sheet includes no corresponding delete pin apertures.

The circuit board 176 employed in practicing the present invention has a plurality of pin socket receiving apertures 178. Each aperture is plated through during the board fabrication process, and conductive material on the aperture wall electrically communicates with a conductive pad 180 adjacent each aperture. Conductive pads are 0.025 inch in width and 0.050 inch in length.

The second multilayer sheet 168, after removal of the lower release layer 174, is applied to the circuit board 176 such that the adhesive layer 172 confronts the circuit board 176 surface. Precise alignment of the sheet 168 with the circuit board 176 causes conductive pads 180 to be exposed through apertures 175 of the multilayer sheet 168.

The apertures 178 of the circuit board 176 are 0.040 inch in diameter and are disposed in rows and columns corresponding in center locations to the center locations of guide pin apertures 16 of the wiring fixture plate 10.

Figure 26:
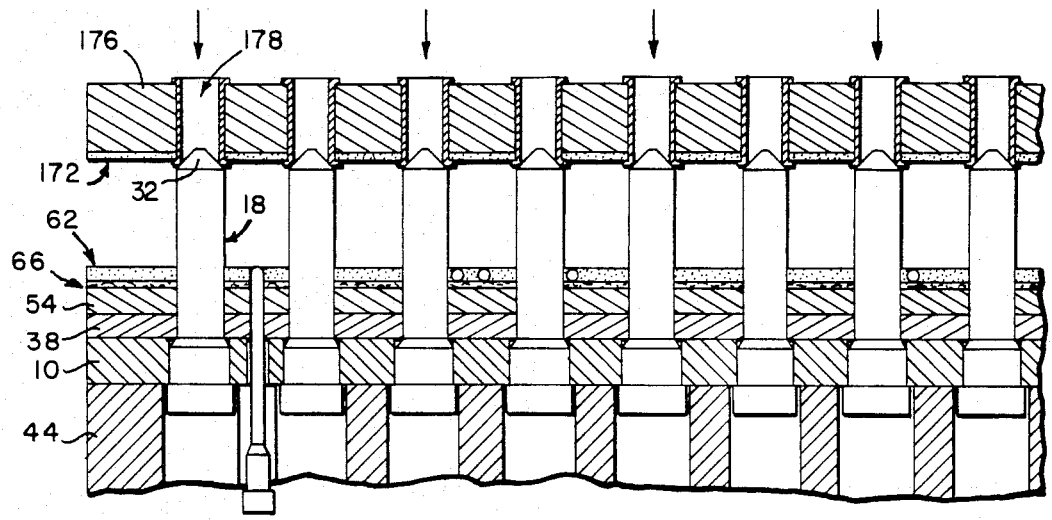
FIG. 26 is a sectional side view illustrating the registration of the printed circuit board of FIG. 24 over the guide pins and wiring fixture plate.

The adhesive layer 172 is adhered to the printed circuit board 176 under slight compressive pressure, and following adherence of the adhesive layer 172 the upper release layer 170 of the multilayer sheet 168 is peelably removed from the adhesive layer 172. The printed circuit board 176 and adhered adhesive layer 172 are coaxially aligned above respective guide pins 18, as illustrated in FIG. 26. The printed circuit board 176 is disposed such that the adhesive layer 172 confronts the plurality of wire nets and the underlying adhesive layer 62.

The socket pin receiving apertures 178 of the circuit board 176 are of diameter smaller than the diameter of the shank 30 of the guide pin 18, as previously indicated. The diameter of the socket pin receiving apertures 178 is 0.040 inch, and the diameter of the shank 30 of delete pin 18 is 0.065 inch. The chamfered end 32 of guide pin 18 precisely align with apertures 178 upon application of compressive pressure to the fixture 10 and circuit board 178.

Figure 27:
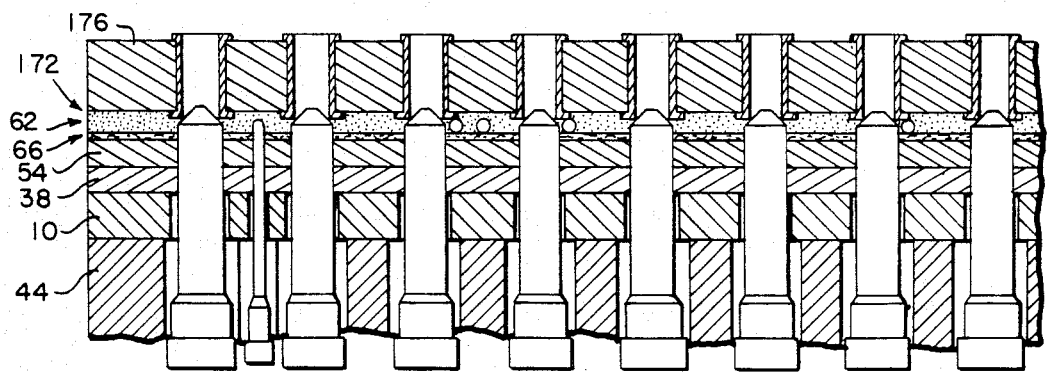
FIG. 27 is a sectional side view illustrating mating of the printed circuit board with the underlying wire mat after application of compressive pressure to the circuit board and mat.
Figure 28:
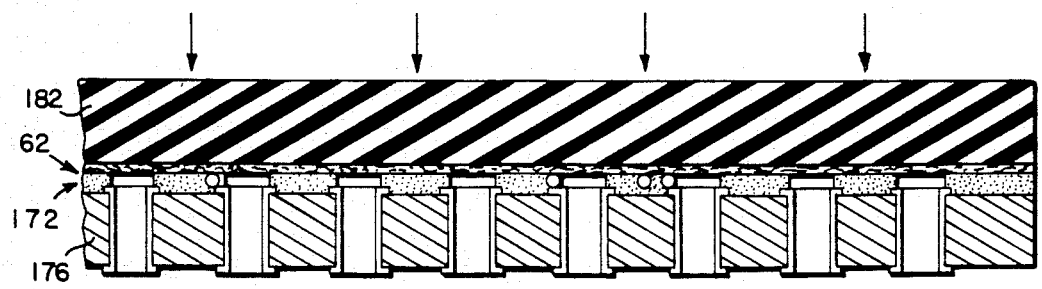
FIG. 28 is a sectional side view illustrating conformal coating of the circuit board and wire nets by application of compressive pressure to the wired surface through a rubber pad.
Figure 29A:
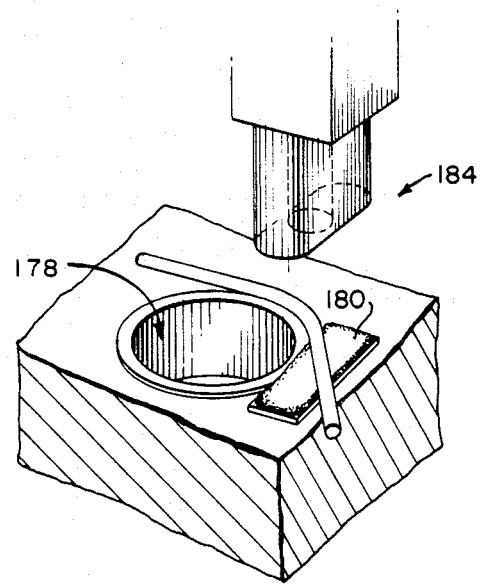
FIG. 29A is a schematic view of a soldering tip in accordance with the present invention disposed above an intended location of interconnection.
Figure 29B:
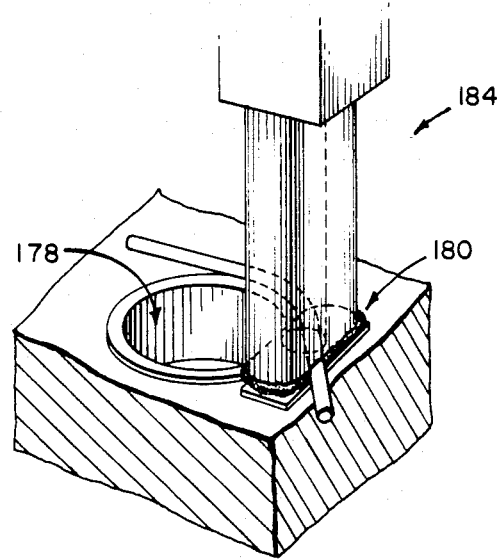
FIG. 29B is a shematic view of the soldering tip of FIG. 29A engaging a selected wire net point and underlying conductive pad.

In a mating operation, the plurality of wire nets are adhered to the circuit board 176. Continued application of compressive pressure to the circuit board 176 and the fixture 10 urges the guide pins 18 downward through the fixture plate 10 and into the clearance plate 44, as illustrated in FIG. 27. Adhesive layers 172 and 78 achieve adhesive contact under compressive pressure thereby precisely locating wire nets of the wire 80 on the circuit board 176. By reason of the registration of the wire nets with the circuit board 176 achieved in accordance with this invention, selected points of wire nets confront selected conductive pads 180 after mating of the wire mat with the circuit board 176, as illustrated in FIG. 27. The circuit board 176 with adhesive layers 172 and 62, adhered thereto wire nets embedded therein and release layer 66 are then removed from the fixture. After removal of the circuit board 176 and adhered wire mat from the fixture, the release layer 66 is peelably removed from the adhesive layer 62. A low durometer rubber pad 182 is applied in confronting relation to the adhesive layer 62, and compressive pressure is applied to the circuit board 176 and rubber pad 182 to conformally coat the wire net 80 and circuit board 176 with adhesive material.

Following this conformal coating step, the circuit board 176 is placed in an oven and heated at elevated temperature to cure the thermoplastic adhesive layer. Typically, the adhesive is cured for three (3) hours at a temperature of approximately 260° F.

The circuit board 176 is next coated with a solder flux by spraying, brushing, or any other suitable technique and the coated board is subjected to elevated temperature briefly to increase the viscosity of the flux. The board 176 is then loaded onto an X-Y axis table, having positioned thereover a soldering head 184 of the type illustrated in FIGS. 29A and 29B. The table is controlled to dispose a conductive pad 180 having a wire confronting the pad, directly beneath the soldering head 184. The soldering head 184, upon actuation, moves downward from the position illustrated in FIG. 29A to the position illustrated in FIG. 29B, urging the insulated wire into contact with the pad 180 and causing the wire insulation to vaporize in the vicinity of a pad 180. The pad 180 and confronting wire are heated, and solder on the respective pad reflows around the wire to complete the interconnection of the wire with the selected pad. The X-Y axis table and soldering head 184 are automatically cylced until all wires confronting conductive pads 180 have been soldered to the respective pads. Upon completion of the soldering operation, the circuit board 176 is fully interconnected in accordance with a pre-defined circuit wiring pattern.

The wired circuit board produced in accordance with the present invention is ultrasonically cleaned preparatory to insertion of pin receiving sockets, integrated circuits and other electrical components. The circuit board 176 in accordance with the present invention is adapted to accommodate all commonly available dual-in-line components. Integrated circuits having 0.4 inch or 0.5 inch inter-row spacing are accommodated by slight deformation of integrated circuit leads to fit between selected columns of integrated circuit pin sockets disposed within pin socket receiving apertures located on 0.45 inch spacing.

Another embodiment of the invention is illustrated in FIGS. 30A through 49B, in which the severing operation is performed after the wire routing operation and the mating operation. A wire mat is first produced by laying an adhesive layer over a pair of fixture plates having pins upwardly extending therefrom, and then routing a continuous insulated wire along a predetermined path through the upwardly extending pins. The continuous insulated wire is adhered to the underlying adhesive layer. A second adhesive layer is adhered to a circuit board having a defined conductive pad layout ahd having apertures in a pattern corresponding to the location of guide pins in the fixture. The circuit board with the second adhesive layer adhered thereto is registered above the wire mat, and compressive pressure is applied to the circuit board to cause the wire mat to adhere to the circuit board. Compressive pressure is next applied to the adhesive layers via a low durometer rubber sheet to conformally coat the continuous wire and underlying circuit board with adhesive material. Thereafter, the adhesive material is cured at an elevated temperature. Wires confronting selected conductive pads are then soldered to the pads in a solder reflow operation thereby electrically interconnecting the pads. The continuous wire is next severed at selected locations in a cutting operation to produce a plurality of wire segments or nets fixed in position on the circuit board, and electrically interconnecting selected wire nets confront selected conductive pads on the circuit board. As previously discussed, a circuit board in accordance with the present invention may have an identical conductive pad patterns on both sides of the board, thereby permitting single-sided or double-sided wired circuit boards to be produced in the disclosed manner.

Referring to FIGS. 30A through 49B, the continuous insulated wire is routed through a fixture which includes a first fixture plate, of the type illustrated in FIGS. 30A and 30B, and a second fixture plate of the type illustrated in FIGS. 32A and 32B.

The first fixture plate 186 includes apertures 188 sized for clearance fit with shanks 24 of delete pins 14 and apertures 190 sized to slideably receive the shoulders 28 of guide pins 18 illustrated in FIG. 2B. Guide pin apertures 190 and delete pin apertures 188 are disposed in rows and columns having centers located as discussed with respect to FIG. 1A. In the illustrated embodiment, guide pin apertures 190 have a diameter of 0.076 inch and delete pin apertures 188 have a diameter of 0.036 inch. The first fixture plate 186 is typically fabricated of a hard, flat material such as metal, epoxy, plastic, or any other suitable material, and is illustrated as having a thickness of approximately 0.062 inches.

The second fixture plate 192, illlustrated in FIGS. 32A and 32B, includes delete pin apertures 194 and guide pin apertures 196 on centers corresponding to center locations of the delete pin apertures 188 and the guide pin apertures 190 of the first fixture plate 186. The delete pin apertures 194 in the second fixture plate 192 are sized for interference fit with the shoulder 22 of delete pins 14. The guide pin apertures 196 of the second fixture plate 192 are sized for clearance fit with the heads 26 of the guide pins 18. In the present embodiment, the diameter of the delete pin apertures 194 is 0.031 inch to cause an interference fit upon insertion of the delete pin shoulders 22 of diameter 0.033 inch, and guide pin apertures 196 are illustrated as having a diameter of 0.085 inch to provide a clearance fit with the guide pin 18 head 26 diameter of 0.078 inch.

As illustrated in FIG. 31, guide pins 18 are slideably disposed in guide pin apertures 190 of the first fixture plate 186. Similarly, as illustrated in FIG. 33, delete pins 14 are slideably disposed in delete pin apertures 194 of the second fixture plate 192. The shoulders 22 of the delete pins 14 are sized for interference fit with the apertures 194 of the second fixture plate 190, and thus, after insertion of the pins 14 in the plate 192, the delete pins 14 remain frictionally engaged in the respective apertures 194. The guide pins 18 are retained in the first fixture plate 186 via use of a pin retaining plate 198 of the type illustrated in FIGS. 34A and 34B. The pin retaining plate 198 includes delete pin apertures 200 and guide pin apertures 202 with centers in a pattern corresponding to center locations of guide and delete pin apertures on the first and second fixture plates. The delete pin apertures 200 in the pin retaining plate 198 are sized for clearance fit with the shanks 24 of delete pins 14, and the guide pin apertures 202 of the pin retaining plate 198 are sized for interference fit with the shanks 30 of guide pins 18. In the present embodiment, delete pin apertures 200 of the pin retaining plate 198 have a diameter of 0.036 inch and guide pin apertures 202 of the pin retaining plate 198 have a diameter of 0.062 inch.

As illustrated in FIG. 35, the first fixture plate 186 with guide pins 18 disposed in respective apertures 190 is inverted such that heads 26 of the guide pins 18 rest on a backing plate 204. The pin retaining plate 198 is registered above the first fixture plate 186 with centers of guide pin apertures 202 coaxially aligned with centers of guide pin apertures 190 of the first fixture plate. The pin retaining plate 198 is forced downward over the shanks 30 of the guide pins 18 into confronting relation with the first fixture plate 186, and the pin retaining plate 198 thereby maintains the guide pins 18 in fixed position within the first fixture plate with shanks 30 upwardly extending through the first fixture plate 186. The pin retaining plate 198 is typically fabricated of a resilient material, such a chipboard, and is presently shown to be approximately 0.030 inch in thickness. The first fixture plate 186, with guide pins 18 retained therein by the pin retaining plate 198, is coaxially aligned above the second fixture plate 192 with centers of delete pin apertures 188 of the first fixture plate 186 coaxially aligned above delete pin apertures 194 of the second fixture plate 192. The first fixture plate 186 is slideably disposed over the shanks 24 of delete pins 14 upwardly extending from the second fixture plate 192 such that the first fixture plate 186 is in confronting relation with the second fixture plate 192, and shanks of the delete pins 14 and guide pins 18 are upwardly extending through the top surface of the first fixture plate 186, all as illustrated in FIG. 37.

In a next operation, a first multilayered sheet 206, of the type illustrated in FIGS. 36A and 36B, is slideably disposed over the shanks of guide pins 18 and delete pins 14 after removing one layer of the multilayer sheet. The first multilayered sheet 206 includes an adhesive layer 208, an upper release layer 210, and a lower release layer 212. The upper release layer 210 is typically fabricated of a release paper impregnated with a wax-like material to permit peelable removal of this layer from the adhesive layer 208. The lower layer 212 in the present embodiment is a thin polyester layer which is also peelably removable from the adhesive layer 208 and which is dimensionally stable under varying conditions of temperature and humidity. The first multilayered sheet 206 includes delete pin apertures 214 and guide pin apertures 216 with center locations corresponding to the center locations of apertures of the multilayered sheet illustrated in FIG. 36A.

The upper release layer 210 is peelably removed from the adhesive layer 208 and thereafter, the adhesive layer 208 and the lower layer 212 are slideably disposed over the guide pins 18 and the delete pins 14 upwardly extending through the pin retaining plate 198 such that the lower layer 212 of polyester material confronts the pin retaining plate 198 while leaving the top surface of the adhesive layer 208 upwardly exposed.

Figure 38A:
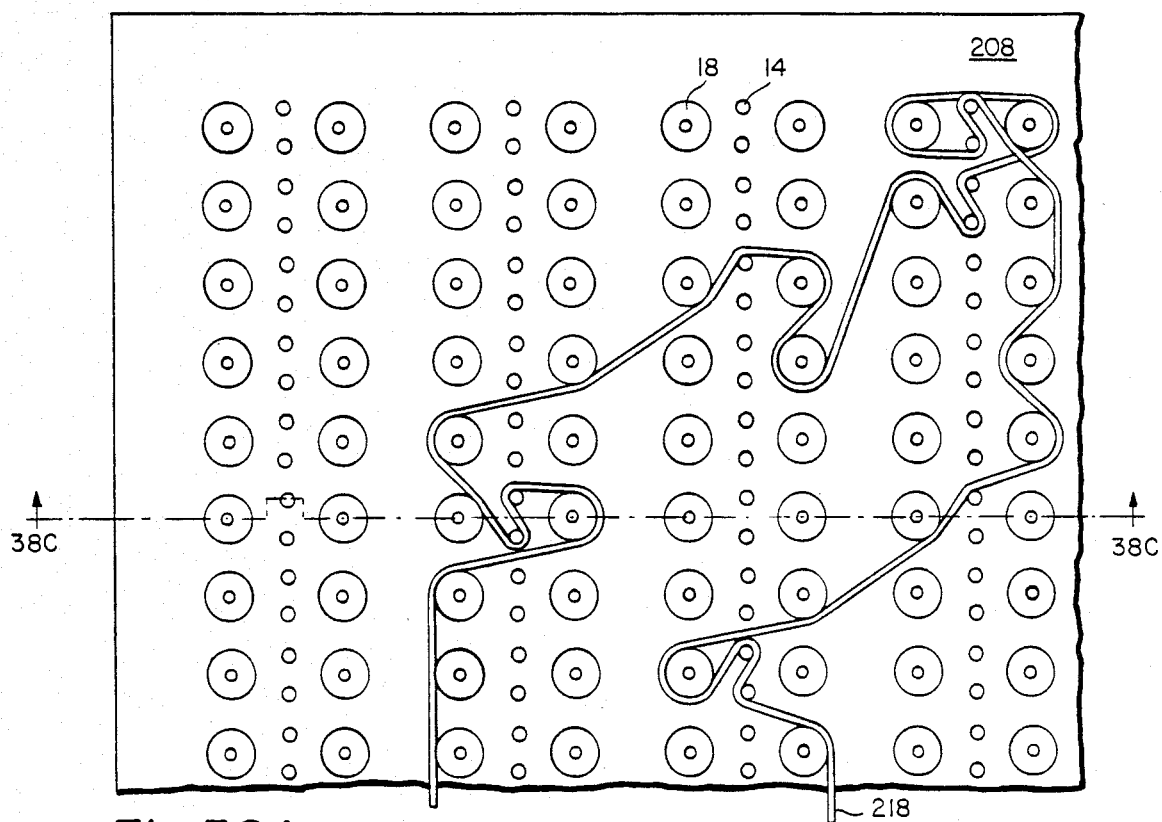
FIG. 38A is a partial top view of the first fixture plate after routing of a continuous wire through respective pins upwardly projecting through the first fixture plates.
Figure 38B:
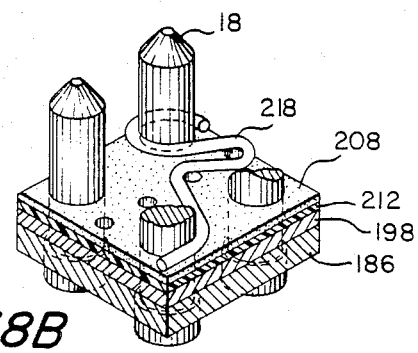
FIG. 38B is a cutaway perspective view illustrating the first fixture plate after routing of the continuous wire thereon and following removal of the second fixture plate and delete pins therefrom.
Figure 38C:
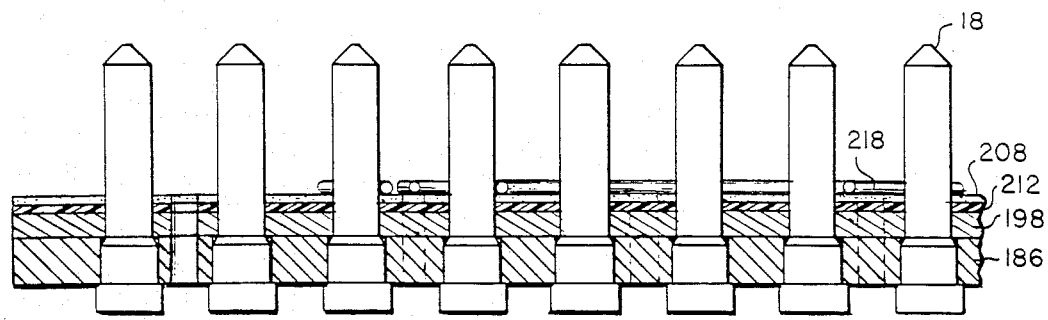
FIG. 38C is a sectional elevation view of the fixture plate and routed wire of FIG. 38A.

As illustrated in FIG. 38A, a continuous wire 218 is next routed along a predetermined path through respective guide and delete pins in accordance with wiring conventions and techniques previously described with respect to the routing of continuous wire 80. After routing of the continuous wire 218 through the guide pins 18 and delete pins 14 adjacent the adhesive layer 206, the continuous wire 218 is adhered to the adhesive layer 208 to fix the wire along the routed path, and the second fixture plate 192 is separated from the first fixture plate 186 thereby withdrawing delete pins 14 as illustrated in FIGS. 38B and 38C.

A second multilayered sheet 220 comprising an upper release layer 222, an adhesive layer 224 and a lower layer 226 is precisely registered above a circuit board 228 of the type illustrated in FIG. 40 and previously described with particularity with respect to FIG. 24. The circuit board 228 includes conductive pads 230 and apertures 232 of the size and description previously discussed with respect to the structure depicted in FIG. 24. The lower layer 226 may be of a polyester or similar material to afford greater dimensional stability under varying conditions of temperature and humidity. The upper layer 22 of the multilayered sheet 220 is peelably removed from the adhesive layer 224 and the adhesive layer 224 is adhered to the circuit board 228 as previously discussed. The lower layer 226 is peelably removed from the adhesive layer 224 as illustrated in FIG. 41 preparatory to mating of the circuit board 228 to the continuous wire 218 and adhesive sheet 208.

Figure 42:
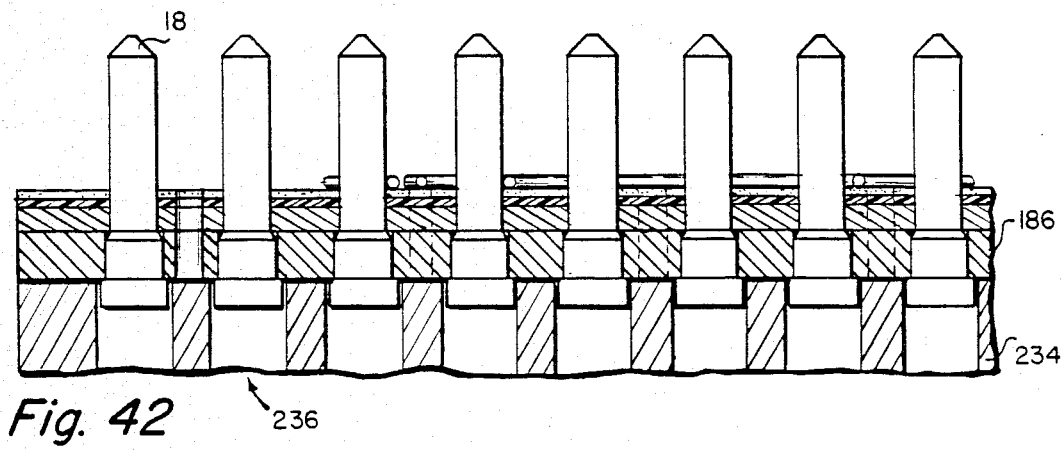
FIG. 42 is a sectional side view illustrating a clearance plate disposed under the first fixture plate after routing of the continuous wire thereon.
Figure 43:
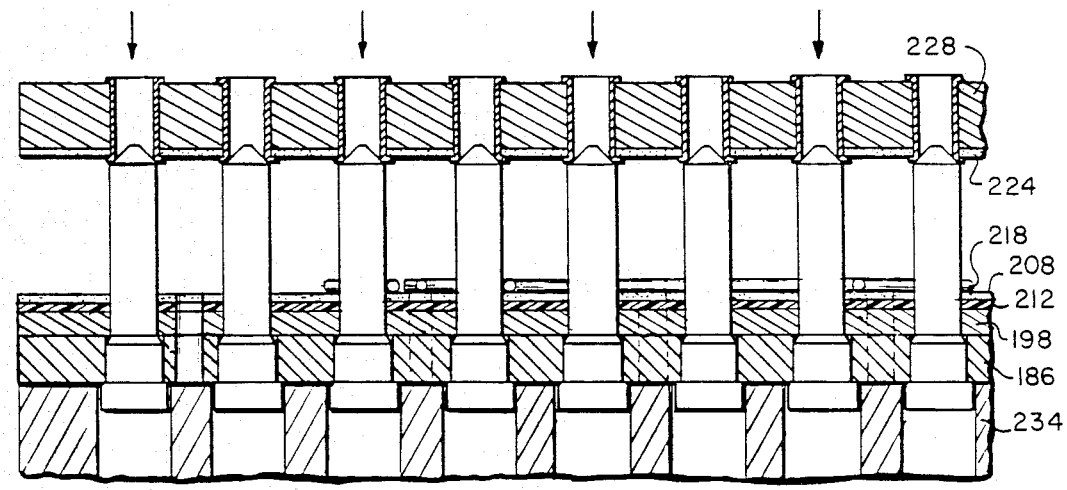
FIG. 43 is a sectional side view illustrating the circuit board disposed above the first fixture plate with apertures of the circuit board in co-axial alignment with guide pins upwardly extending through the first fixture plate.
Figure 44:
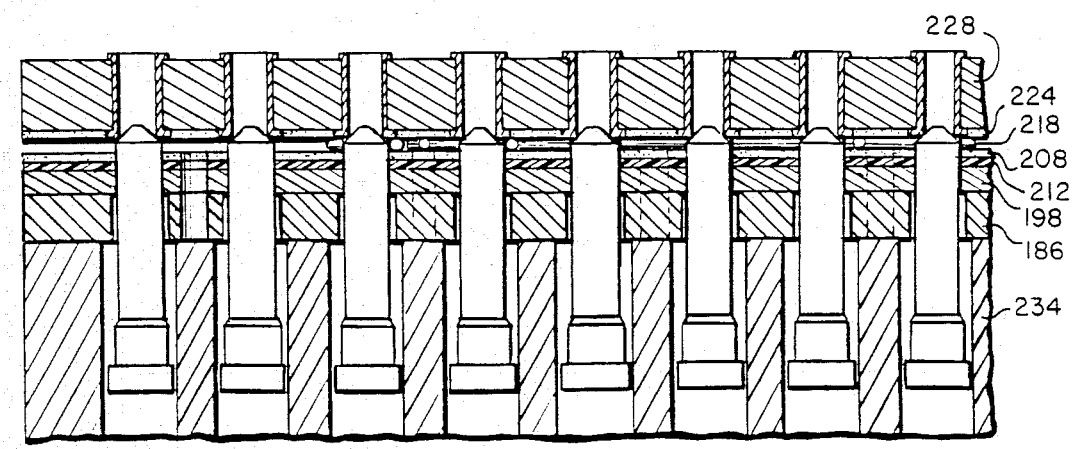
FIG. 44 is a sectional side view illustrating compression of the circuit board and the second multilayered sheet adhered thereto into confronting relation with the adhesive layer of the first multilayered sheet to adhere the continuous wire to the circuit board.
Figure 45:
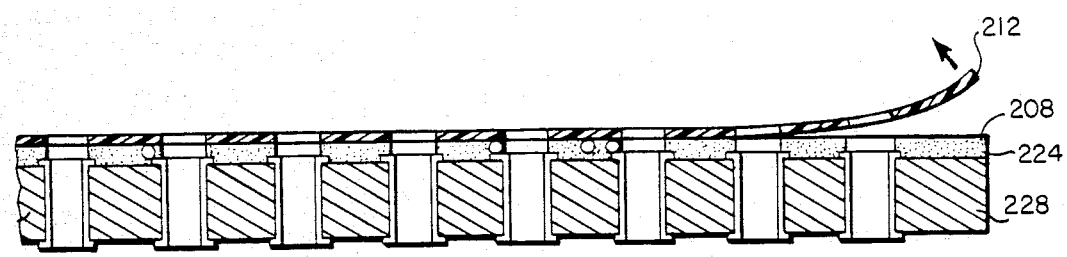
FIG. 45 is a sectional side view illustrating removal of the release layer from the second multlayered sheet after adhesion of the adhesive layer of the second multilayered sheet to the circuit board.
Figure 46:
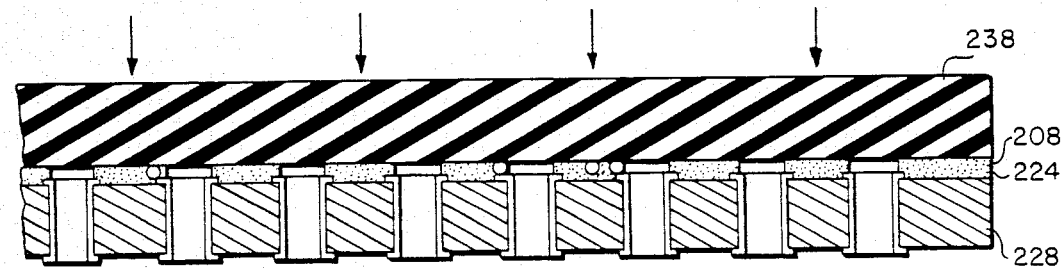
FIG. 46 is a sectional side view illustrating conformal coating of the circuit board and the continuous wire retained between adhesive layers of the first and second multilayered sheets by application of compressive pressure to the wired surface of the circuit board through a rubber pad.

As illustrated in FIG. 42, a clearance plate 234 is disposed below the first fixture plate 186 such that heads of guide pins 18 are disposed within guide pin apertures 236 sized for clearance fit with the heads of guide pins 18. The circuit board 228 is precisely aligned with apertures 232 of the circuit board 228 precisely aligned over chamfered ends 32 of guide pins 18 upwardly extending from the first fixture plate 186 with the adhesive layer 224 adhered thereto downwardly facing and in confronting relation with the adhesive layer 208, as illustrated in FIG. 43. In a mating operation, compressive pressure is applied to the circuit board 228 to force the adhesive layer 224 into adhering contact with the adhesive layer 208 thereby fixing the continuous wire 218 to the circuit board 228. By reason of the registration of the continuous wire 218 with the circuit board 228 selected points of the continuous wire 218 confront selected conductive pads 230 as previously discussed. The mating of the circuit board 228 to the continuous wire 218 and the adhesive layer 208 upon application of compressive force is illustrated in FIG. 44. After mating of the continuous wire 218 to the circuit board 228 the layer 212 of polyester material is peelably removed from the adhesive layer 208 as illustrated in FIG. 45. A low durometer rubber pad 238 is overlaid on the adhesive layer 208, as illustrated in FIG. 46, and compressive pressure is applied to the circuit board 228 and the rubber pad 238 to conformally coat the continuous wire 218 and circuit board 228 with adhesive material comprised of adhesive layers 208 and 224. The adhesive layers adhered to the circuit board 228 are cured by inserting the circuit board 228 with the continuous wire 218 adhered thereto into an oven for approximately three (3) hours and heating at a temperature of approximately 260° F. or by any other equivalent means. Following this initial curing step, a mildly activated resin flux is applied to the side of the circuit board 228 having the continuous wire 218 adhered thereto, and the circuit board is again cured in an oven at elevated temperature for approximately five to ten minutes to increase the viscosity of the flux.

Figure 47A:
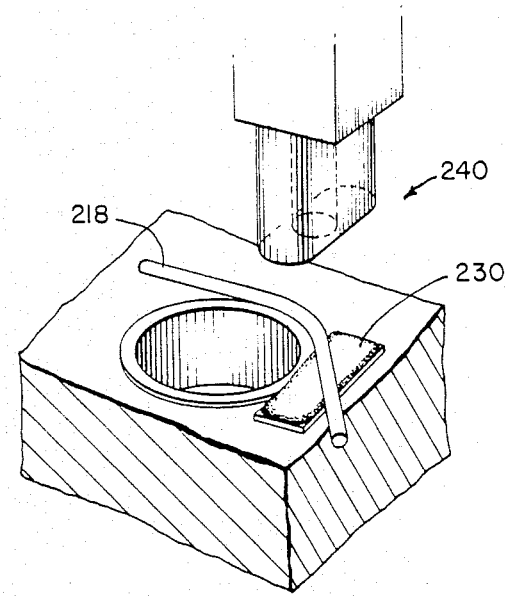
FIGS. 47A and 47B are schematic views illustrating the soldering of a selected point of the continuous wire to a selected pad of the circuit board.
Figure 47B:
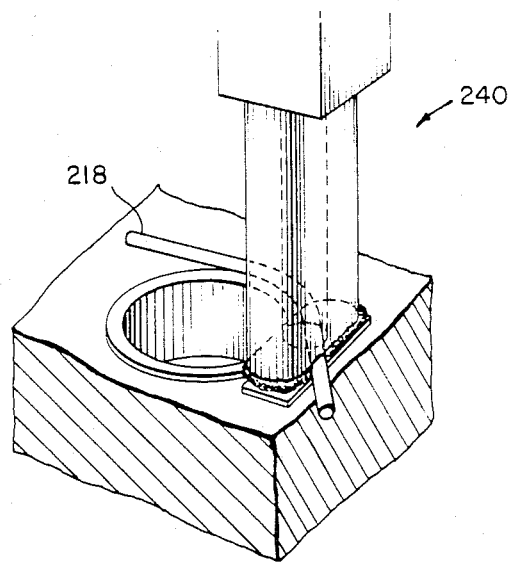

The circuit board 228 is next placed on a soldering machine and the continuous wire 218 is soldered and electrically interconnected to selected conductive pads 230 on the circuit board in the manner illustrated in FIGS. 47A and 47B and as previously discussed. As shown in FIG. 47A, the continuous wire 218 crosses selected conductive pads 230 due to the precise registration of the wire mat with the circuit board which is achieved by routing of the continuous wire through precisely aligned guide and delete pins. A soldering head 240 of the type previously described is actuated for downward travel from the position illustrated in FIG. 47A to the position illustrated in FIG. 47B. The head 240 urges the insulated wire 218 into contact with the pad 230 and causes the insulation on the wire 218 to vaporize in the vicinity of the pad 230. The pad 230 and wire 218 are heated until solder on the pad reflows around the wire to complete a soldered connection of the wire 218 to the pad 230 at the selected location.

Finally, after soldering of selected points of the continuous wire to predetermined conductive pads, the continuous wire is severed at selected locations to form a plurality of wire segments which interconnect selected conductive pads 230 on the circuit board 228.

Figure 48:
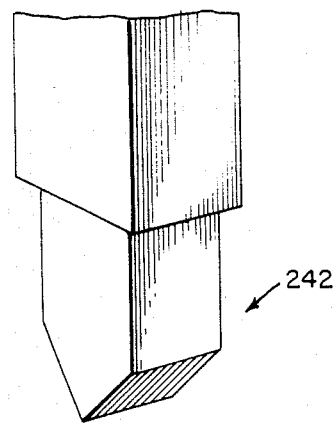
FIG. 48 is a perspective view of a cutting head employed in accordance with the present invention.

The continuous wire 218 is severed employing a cutting head 242 of the type illustrated in FIG. 48. The cutting head shown in the present embodiment is a displacement cutter with a 90° included angle. The cutter is fabricated of hardened steel, carbide, or any other suitable material.

Figure 49A:
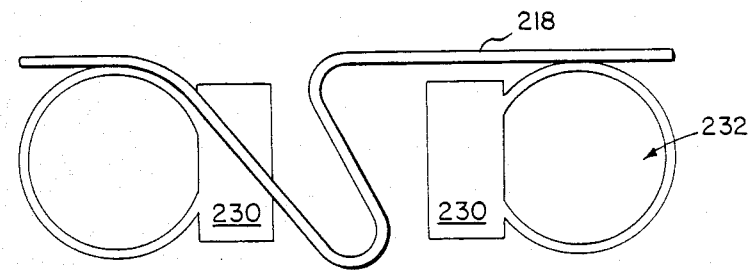
FIG. 49A is a partial top view of the wired circuit board before severance of the continuous wire.
Figure 49B:
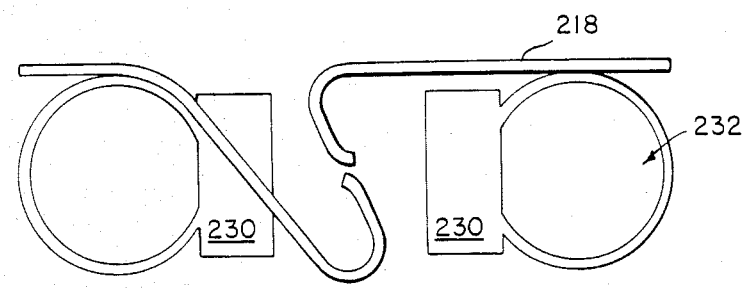
FIG. 49B is a partial top view of the circuit board of FIG. 49A after severance of the continuous wire with the cutting head of FIG. 48.

An exemplary illustration of the circuit board prior to severance of the wire 218 is provided in FIG. 49A. The cutting head 242 is operated under automated control in a preferred embodiment of the invention. Upon actuation, the cutting head 242 impacts and severs the wire 218 between adjacent conductive pads 230 on the circuit board 228 as illustrated in FIG. 49B. As shown in FIG. 49B the cutting head displaces the ends of the wire 218 thereby creating an electrical discontinuity at the point of severance. The wire 218 is severed in this manner at predetermined locations to form a plurality of wire segments or nets in which each wire segment interconnects selected conductive pads 230 on the circuit board 228.

Finally, the board is cleaned via use of an ultrasonic degreaser or any other suitable cleaning means known in the art.

Single or double sided wired circuit boards may be produced in the disclosed manner.

The above described invention is illustrative of a novel method and circuit board which permits improved production efficiencies and overcomes significant disadvantages of prior wiring methods. Other modifications, embodiments and departures from the present disclosure are possible without departing from the inventive concept contained herein. Consequently, the invention is to be viewed as embracing each and every novel feature and novel combination of features present in or possessed by the technique and articles herein disclosed and are limited solely by the scope and spirit of the appended claims.

What is claimed is:

1. A method for producing a wired circuit board comprising the steps of:
   routing a continuous insulated wire along a predetermined path through a plurality of pins projecting from a fixture plate;
   fastening the continuous wire to a supporting layer to maintain said wire in a fixed position along said path;
   mating a circuit board having a plurality of conductive pads disposed on the surface of the board with the wire such that selected points of the wire confront selected ones of the conductive pads; and
   interconnecting said selected points of the wire with selected ones of said conductive pads.

2. The method of claim 1 further including, after said routing step, the step of severing the continuous wire at at least one selected location to form a plurality of wire segments.

3. The method of claim 1 wherein said fastening step includes the step of adhering the continuous wire to a supporting layer of adhesive material.

4. The method of claim 3 further including, after said routing step, the step of severing the continuous wire at at least one selected location to form a plurality of wire segments.

5. The method of claim 3 wherein said severing step is performed between said fastening step and said mating step.

6. The method of claim 3 wherein said severing step is performed between said mating step and said interconnecting step.

7. The method of claim 2 wherein said interconnecting step includes the step of soldering selected points of the wire to selected ones of the conductive pads confronted by said wire.

8. A method of producing a wired circuit board comprising the steps of:
   routing a continuous wire along a predetermined path through first and second pluralities of pins projecting from a fixture plate;
   adhering the continuous wire to a first adhesive layer to maintain said wire in fixed position along said path;
   removing said second plurality of pins from said fixture plate; and
   mating a circuit board having a plurality of conductive pads disposed in a predetermined arrangement on said board with the wire such that selected points of the wire confront selected conductive pads on the circuit board.

9. The method of claim 8 wherein said mating step includes the steps of:
   adhering a second adhesive layer to said circuit board on a first circuit board side;
   compressing said circuit board and second adhesive layer adhered thereto into confronting contact with said first adhesive layer to adhere said wire to said circuit board between said first and second adhesive layers.

10. The method of claim 8, further including after said mating step, a step of curing said first adhesive layer at a predetermined temperature for a predetermined time.

11. The method of claim 9, further including after said routing step, a step of severing the continuous wire at at least one selected location to form a plurality of wire segments.

12. A method of producing a wired circuit board comprising the steps of:
   loading a first plurality of pins in a first plurality of apertures of a first fixture plate having a wiring surface such that one end of said first plurality of pins projects above said wiring surface;
   loading a second plurality of pins in a first plurality of apertures of a second fixture plate having an upper surface such that one end of each of said second plurality of pins projects above said upper surface;
   locating said first fixture plate with said first plurality of pins disposed therein over said second fixture plate with said second plurality of pins disposed therein such that said one end of at least some of said second plurality of pins projects through said second plurality of apertures in said first fixture plate and above said wiring surface;
   routing a continuous wire along a predetermined path through said first and second pluralities of pins projecting above said wiring surface of said first fixture plate;
   adhering the continuous wire to a first adhesive layer to maintain said wire in fixed position along said path;
   withdrawing said second fixture plate and said second plurality of pins disposed therein from said first fixture plate;
   adhering a second adhesive layer to a wiring surface of a circuit board having a plurality of electrically conductive pads disposed in a predetermined arrangement on said wiring surface;

registering said circuit board above said first adhesive layer and wire adhered thereto such that the second adhesive layer adhered to the wiring surface confronts the first adhesive layer;

compressing the first adhesive layer and adhered continuous wire into confronting adhered contact with the second adhesive layer adhered to said circuit board such that selected points of the continuous wire confront selected ones of the conductive pads;

soldering selected points of the continuous wire to selected ones of said pads; and severing the continuous wire at selected locations to form a plurality of wire segments interconnecting selected ones of said pads.

* * * * *